US006218068B1

(12) United States Patent
Tanaka et al.

(10) Patent No.: US 6,218,068 B1
(45) Date of Patent: Apr. 17, 2001

(54) IMAGE RECORDING METHOD

(75) Inventors: Toshiharu Tanaka; Shintaro Washizu, both of Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/504,937

(22) Filed: Feb. 16, 2000

(30) Foreign Application Priority Data

Feb. 19, 1999 (JP) .................................................. 11-041324

(51) Int. Cl.[7] ................................ B41M 5/26; G03F 7/26
(52) U.S. Cl. ......................... 430/138; 430/256; 430/257; 430/293; 430/945
(58) Field of Search .................................... 430/138, 945, 430/257, 256, 260, 293; 503/201, 227

(56) References Cited

U.S. PATENT DOCUMENTS 5,043,314 * 8/1991 Suzuki et al. ......................... 503/214
5,091,280 * 2/1992 Yamaguchi et al. .................. 430/138
5,283,152 * 2/1994 Feldman et al. ..................... 430/138

FOREIGN PATENT DOCUMENTS

| 1-186385 | 7/1989 | (JP) . |
| 6-255272 | 9/1994 | (JP) . |
| 8-290678 | 11/1996 | (JP) . |
| 86/04859 | 8/1986 | (WO) . |

* cited by examiner

Primary Examiner—John A. McPherson
(74) Attorney, Agent, or Firm—Sughrue, Mion, Zinn, Macpeak & Seas, PLLC

(57) ABSTRACT

An image recording method using a transfer system is provided. In a completely dry processing system in which a developer or the like is not required, laser light of a range from blue to red or a compact and inexpensive infrared laser or the like can be used so that an image with high sensitivity, high sharpness, excellent hue reproduction and high quality can be formed.

10 Claims, No Drawings

IMAGE RECORDING METHOD

BACKGROUND OF THE INVENTION

1. Field of the Invention

The present invention relates to an image recording method using a monochrome or multicolor transfer type light- and heat-sensitive material which can be used with various light sources of the range from ultraviolet to infrared. More specifically, the present invention relates to an image recording method which can be applied to color proofs or the like, and in which high recording speed can be realized, and an inexpensive writing laser can be used because materials having excellent sensitivity are used.

2. Description of the Related Art

Various dry-type image recording methods, in which a liquid developer and the like are not used, have been studied. As a direct image forming method, a method using a photocurable composition has attracted attention, and such methods are disclosed in, for example, Japanese Patent Application Laid-Open (JP-A) Nos. 3-87827, 4-211252 and the like. On the other hand, as a method of forming images by transfer, methods in which a predetermined color component in a recording material is moved (transferred) to an image receiving material by using a thermal head, a laser, or the like, have been studied.

The method using a photocurable composition is characterized in that a photocurable composition contained in a recording material is cured by exposure to light to form a latent image. A component, which is contained in the unexposed portion in the recording material and reacted upon the color forming reaction or decolorizing reaction by being heated, moves within the recording material and forms a color image. When the above-described recording material is used, the recording material is exposed to light which has passed through an original image. The exposed portion is cured to form a latent image. Then the recording material is heated and the component, which is contained in the uncured portion (the unexposed portion) and reacted upon the color reaction or decolorizing reaction, moves to form a visible image.

A perfect dry system free of waste products can be realized with this method.

These recording materials can be applied to various applications. However, in all of these applications, images are recorded by only UV light or short wave visible light, and compact and inexpensive infrared lasers as well as light of the range from green to red cannot be used. Further, although these recording materials can be used in various applications, it is difficult to reproduce an image on a desired support in accordance with applications only by this method.

Examples of the recording method by transfer include a method in which a recording material containing a sublimation type dye and a binder is employed, a method in which a heat-melting recording layer, containing a pigment, a dye and a binder, is transferred, and the like.

Among the aforementioned methods, in the method using a sublimation-type dye, the sharpness and durability of the image are inferior. In the method using the heat melting recording layer, the heat sensitivity of the heat-melting recording layer is high and the heat-melting recording layer is inexpensive, but there have been problems with regard to gradation reproduction and color reproduction. Accordingly, there has been desired a recording material which can be obtained by a simple process and has excellent sensitivity and excellent image reproduction. In particular, there has been desired a transfer type recording material which can be used with color proofs or the like, and which has high sharpness and excellent hue reproduction.

SUMMARY OF THE INVENTION

An object of the present invention is to provide an image recording method using a transfer system which image recording method is such that, in a completely dry processing system in which a developer or the like is not required, laser light of the range from blue to red or a compact and inexpensive infrared laser or the like can be used, and an image with high sensitivity, high sharpness, excellent hue reproduction, and high quality can be formed.

The present inventors have found the inventions disclosed in Japanese Patent Application No. 11-36308 (which is incorporated herein by reference) for a black-and-white or color light- and heat-sensitive recording material in which an image can be recorded by using a small and inexpensive infrared laser or laser light of the range from blue to red, and an image with high sensitivity, high contrast, and high image quality can be formed. The present inventors arrived at the present invention by discovering that by using the aforementioned material in a transfer system, an image with high sensitivity, high sharpness and high image quality, which has excellent color reproduction and which can be used as a color proof, can be formed.

Namely, the image recording method of the present invention comprises the steps of (a) providing a light- and heat-sensitive transfer material, the material comprising: (i) a support, (ii) a light- and heat-sensitive layer on the support, wherein the light- and heat-sensitive layer includes a color forming component; and (iii) a heat-bonding layer on the light- and heat-sensitive layer; (b) irradiating the light- and heat-sensitive transfer material with light to form a latent image; (c) placing an image receiving material in surface contact with the light- and heat-sensitive transfer material; (d) heating the materials, wherein color forming components form color in accordance with the latent image so as to form an image; (e) removing the support to transfer the light- and heat-sensitive transfer layer to the image receiving material; and (f) irradiating the light- and heat-sensitive transfer layer with light to fix the image.

Here, as the light-and heat-sensitive transfer layer, a multicolor light- and heat-sensitive material comprises a plurality of light- and heat-sensitive transfer layers, wherein the layers contain color forming components that form colors of different hues.

In a case of using the multicolor light- and heat-sensitive transfer material having a plurality of light- and heat-sensitive transfer layers, in the step of irradiating the light- and heat-sensitive transfer material with light to form a latent image, latent images are formed on all of the light- and heat-sensitive transfer layers, and thereafter the steps of placing an image receiving material, heating the materials, removing the support, and irradiating the light- and heat-sensitive transfer layer with light to fix the image, are carried out in that order. In a case of using a plurality of light- and heat-sensitive transfer material which have light- and heat-sensitive transfer layers which have different color forming hues with light (for example, a first and second light- and heat-sensitive transfer materials are used), the above steps (b), (c) and (d) are conducted for the first light- and heat-sensitive transfer material, steps (b), (c) and (d) are conducted for the second light- and heat-sensitive transfer material, and thereafter step (e) is conducted for the first and second light- and heat-sensitive transfer materials.

Here, the light- and heat-sensitive transfer material includes a plurality of light- and heat-sensitive transfer layers having color forming hues of black, cyan, magenta, yellow.

DESCRIPTION OF THE PREFERRED EMBODIMENTS

A detailed description will be given hereinafter of an image recording method of the present invention and a light- and heat-sensitive recording material which is appropriately used in the method.

The light- and heat-sensitive recording material used with the image recording method of the present invention is a light- and heat-sensitive transfer material which is formed by laminating on a support a light- and heat-sensitive transfer layer and a heat-bonding layer in that order. Other known layers, for example, a protective layer, an intermediate layer, a UV absorption layer and the like may be provided at any positions as long as the support, the light- and heat-sensitive transfer layer and the heat-bonding layer are disposed in that order. When the recording material includes a single layer of the light- and heat-sensitive transfer layer, the recording material is monochrome. When the recording material is formed by superposing a plurality of light- and heat-sensitive transfer layers each of which contains a color forming component which has a different color forming hue, the recording material is multicolor.

A preferable aspect of the light- and heat-sensitive transfer layer (image recording layer) of the light- and heat-sensitive transfer material used with the image recording method is: (a) a light- and heat- sensitive transfer layer which comprises 1) thermally-responsive microcapsules which encapsulate a color forming component A and, outside the microcapsules, 2) a photo-polymerizable composition which contains at least i) a compound B which is substantially colorless and has, within the same molecule, a polymerizable group and a moiety which reacts with the color forming component A to form color, and ii) a photoinitiator, or (b) a light- and heat-sensitive transfer layer which comprises 1) thermally-responsive microcapsules which encapsulate a color forming component A and, outside the microcapsules, 2) a photo-polymerizable composition which contains at least i) a substantially colorless compound C which reacts with the color forming component A to form color, ii) a substantially colorless compound D which has, within the same molecule, a polymerizable group and a moiety which suppresses the reaction of the color forming component A and the compound C, and iii) a photoinitiator. The light- and heat-sensitive transfer material is formed by applying one or two or more light- and heat-sensitive transfer layers of (a) and (b).

In the light- and heat-sensitive transfer layer (a), by carrying out exposure to the desired image shape, the photo-polymerizable composition outside the microcapsules polymerizes and cures by radicals generated from the photoinitiator so that a latent image of the desired image shape is formed. Then, the compound B present in the unexposed portion moves within the recording material due to heating, and reacts with the color forming component A within the capsules so as to form color.

Accordingly, the present invention is a positive type light- and heat-sensitive transfer layer in which color is not formed at the exposed portions and color is formed in an imagewise manner at the unexposed, uncured portions.

In the light- and heat-sensitive transfer layer (b), by effecting exposure to the desired image shape, the compound D having the polymerizable group is polymerized by radicals generated from the photoinitiator which begins a reaction due to exposure, and the film cures so that a latent image of the desired image shape is formed. The compound C is moved depending on the film characteristic of the latent image (the cured portion), and reacts with the color forming component A within the capsules to form the image.

Accordingly, the present invention is a negative type light- and heat-sensitive transfer layer in which color is formed in an imagewise manner at the exposed portion.

In the present invention, the light- and heat-sensitive transfer material, which is structured by forming on the support a plurality of light- and heat-sensitive transfer layers, may be used. In this case, a light- and heat-sensitive transfer material may be used in which there are superposed a plurality of monochrome light- and heat-sensitive transfer layers in each of which a color forming component which forms color to a different hue is provided in capsules. By irradiating the light- and heat-sensitive transfer material with light in accordance with the respective color forming components contained in the respective layers, a multicolor image can be formed.

Specific aspects of the light- and heat-sensitive transfer layer include the following (1) and (2).

(1) As the light- and heat-sensitive transfer layer, the light- and heat-sensitive recording layer disclosed in JP-A No. 3-87827 may be used which comprises, outside the microcapsules, a photo-curable composition comprising (A) a compound which has, within the same molecule, an electron accepting group and a polymerizable group and (B) a photoinitiator, and which comprises an electron donating colorless dye which is encapsulated in microcapsules.

In the light- and heat-sensitive transfer layer, the photo-curable composition outside the microcapsules polymerizes and cures due to exposure so that a latent image is formed. Then, the electron accepting compound present in unexposed portions moves within the recording material by being heated and reacts with the electron donating colorless dye within the microcapsules to form color. Accordingly, the cured latent image portions of the exposed portions do not form color and only the uncured portions form color, so that a sharp positive image with high contrast can be formed.

(2) As the light- and heat-sensitive transfer layer, a light- and heat-sensitive recording layer disclosed in JP-A No. 4-211252 may be used, which comprises, outside microcapsules, an electron accepting compound, a polymerizable vinyl monomer and a photoinitiator, and an electron donating colorless dye encapsulated in microcapsules.

The mechanism for image formation according to the recording layer disclosed in JP-A No. 4-211252 is unclear but is considered to be as follows. The vinyl monomer which exists outside the microcapsules is polymerized by exposure. On the other hand, the electron accepting compound which is present at the exposed portion is not comprised in the formed polymer at all, and instead, the interaction of the electron accepting compound with the vinyl monomer is decreased so that the electron accepting compound is present in a movable state with high diffusion speed.

On the other hand, the electron accepting compound in the unexposed portion is trapped by the vinyl monomer in the unexposed portion. Therefore, by heating, the electron accepting compound in the unexposed portion preferentially moves within the recording material, and reacts with the electron donating colorless dye within the capsules. The electron accepting compound in the unexposed portion cannot penetrate the capsule walls even if it is heated, and does not react with the electron donating colorless dye, so it cannot contribute to color forming. In the light- and heat-sensitive recording material, since the image is formed such that the exposed portion thereof colors and the unexposed portion thereof does not color, a negative image with high sharpness and high contrast can be formed.

The image recording method of the present invention is an image recording method using the above-described light- and heat-sensitive transfer material and comprises, at least, an exposure step in which a photo-polymerizable composition forms a latent image due to imagewise exposure; a color forming step in which a heat-bonding layer surface of the light- and heat-sensitive transfer material and an image receiving material are placed in close contact with one another and heated, and due to heating, a color forming component forms color in accordance with the latent image so that an image is formed; a transfer step in which a support is removed and the light- and heat-sensitive transfer layer is transferred to the image receiving material; and a fixing step in which the surface of the light- and heat-sensitive transfer layer is irradiated with light so that a formed image is fixed and the photoinitiator components are decolorized.

In the above-described exposure step, a photo-polymerizable composition in the layer is exposed to an image shape in accordance with a desired image pattern so that a latent image is formed. Thereafter, by closely contacting a heat-bonding layer surface of the light- and heat-sensitive transfer material with the image receiving material and heating them, a color forming component contained in the light- and heat-sensitive transfer layer reacts with (A) a compound which reacts with the color forming component to form color or (B) a specific group in such a compound, to form color in the shape of the formed latent image so that an image is formed, and the heat-bonding layer surface and the image receiving material are heat-bonded.

As a light source for the image formation used in the exposure step, by using a light absorbing material such as a spectral sensitization compound having absorption in a specific region, or the like, in the light- and heat-sensitive transfer layer, light sources having light source wavelengths in the range from ultraviolet to infrared can be arbitrarily selected and used. Specifically, a light source whose maximum absorption wavelength is in the range of 300 to 1000 nm is preferable.

In this case, it is preferable to appropriately select a light source having a wavelength corresponding to the absorption wavelength of the light absorbing material to be used such as a spectral sensitization compound or the like. By using the light absorbing material selectively, a light source of the range from blue to red, or a compact and inexpensive infrared laser or the like can be used. Not only is the range of applications broadened, but also sensitivity enhancement and sharpness enhancement can be achieved.

Among such light sources, it is preferable to use laser light sources or LEDs of blue, green, red, or the like in view of achieving simplification and compactness of the device and a reduction in the cost.

In the image recording method of the present invention, when the support is removed after carrying out the color forming step, the light- and heat-sensitive transfer layer is bonded to the image receiving material through the heat-bonding layer surface such that the transferred image is formed at the image receiving material side. Thereafter, a fixing step is provided. In the fixing step, by irradiating the entire surface of the light- and heat-sensitive transfer layer by specific light source, the image formed in the color forming step is fixed and the photoinitiator component which remains in the recording layer is deactivated and the coloring of the image due to the photoinitiator component is prevented. By carrying out the fixing step, the pure whiteness of the non-image portion can be enhanced and a chemically stable transferred image can be formed. When a diazonium salt compound is used as the color forming component, the diazonium salt compound which remains in the recording layer after image formation can be deactivated by light irradiation. Therefore, the diazonium salt compound can effectively prevent the density changing and the discoloration of the formed image, and the like, and can contribute to achieving storage stability of the image portion.

Examples of light sources used in the fixing step include various light sources such as a mercury lamp, an ultra-high pressure mercury lamp, an electrodeless discharge-type mercury lamp, a xenon lamp, a tungsten lamp, a metal halide lamp, a fluorescent lamp, and the like.

Among the aforementioned light sources, it is preferable to appropriately select and use a light source having a wavelength corresponding to the absorption wavelength of the photoinitiator used in the light- and heat-sensitive transfer layer of the light- and heat-sensitive transfer material.

The irradiating method in the fixing step by using the aforementioned light sources may be, but is not especially limited to, a method for irradiating the entire surface of the recording layer at once and a method for irradiating the recording surface by scanning or the like to finally irradiate the entire surface thereof. Any methods may be used as long as ultimately the entire recording surface of the light- and heat-sensitive transfer material after image formation is irradiated by substantially uniform irradiating light. In this way, it is preferable to irradiate the entire transfer layer in view of enhancing the effects of the present invention.

With regard to the light irradiating time by using the aforementioned light sources, it is necessary to irradiate for a certain period of time which is necessary for fixing the formed image and thoroughly decolorizing the background portion. In view of obtaining the sufficient image fixability and decolorizability, an irradiating time in a rage of few seconds to several tens minutes is preferable and a few seconds to few minutes is more preferable.

Next, a description will be given of the light- and heat-sensitive transfer material of the present invention used for the image recording method of the present invention. Th light- and heat-sensitive transfer material of the present invention is the above-described light- and heat-sensitive transfer material (a) or (b).

Structural components used in the light- and heat-sensitive transfer material of the present invention will be explained in detail hereinafter.

As the color forming component A encapsulated in the microcapsules in the light- and heat-sensitive transfer layer, a substantially colorless electron donating colorless dye or a diazonium salt compound may be used.

A conventionally known electron donating colorless dye may be used, and any dye may be used as long as it reacts with the compound B or the compound C to form color.

Specific examples of these color forming components include the compounds disclosed in Japanese Patent Application No. 11-36308. Examples of the electron donating compound are disclosed from page 76, line 9 to page 77, line 12 in U.S. application Ser. No. 09/448,829, which is copending in the name of the same assignee of the present application (entire of which is incorporated herein by reference). Electron donating colorless dyes for cyan, magenta and yellow color forming dyes which can be used when the light- and heat-sensitive transfer material of the present invention is used as a full color recording material are disclosed on page 77, lines 13–23 of U.S. Ser. No. 09/448,829.

The electron donating colorless dye is used preferably in the range from 0.1 to 1 g/m² and more preferably in the range from 0.1 to 0.5 g/m² in the light- and heat-sensitive transfer layer. When the amount of the electron donating colorless dye to be used is less than 0.1 g/m², there may be a case in which the color density cannot be sufficiently obtained. When the amount of the electron donating colorless dye to be used exceeds 1 g/m², the coating characteristic may deteriorate, which is not preferable.

The diazonium salt compound may be the compound represented by the following formula:

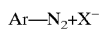

wherein Ar represents an aromatic ring and X⁻ represents an acid anion.

The diazonium salt compound is a compound which causes a coupling reaction with the coupler by heating so as to form color and which is decomposed with light. The maximum absorption wavelength of the diazonium salt compound can be controlled by varying the positions and kinds of substituents at the Ar portion thereof.

The maximum absorption wavelength $\lambda_{max}$ of the diazonium salt compound used in the present invention is preferably 450 nm or less and more preferably 290 to 440 nm from the viewpoint of the effect of the present invention. The diazonium salt compound used in the present invention preferably has 12 or more carbon atoms, solubility with respect to water of 1% or lower, and solubility with respect to ethyl acetate of 5% or higher.

Specific examples of the diazonium salt compound which can be appropriately used in the image recording method of the present invention include, but are not limited to, the compounds disclosed from page 78, line 19 to page 79, last line in U.S. Ser. No. 09/448,829, and the following compounds:

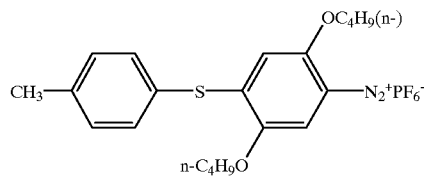

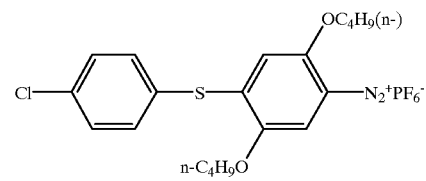

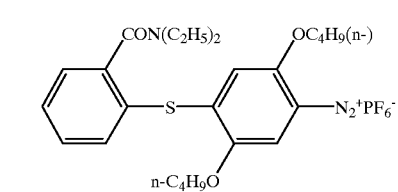

-continued

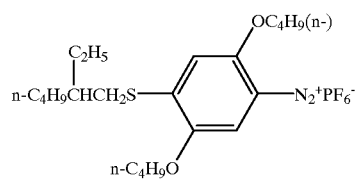

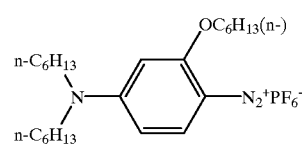

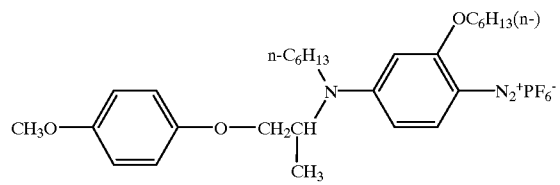

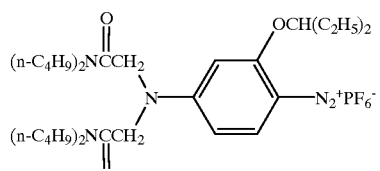

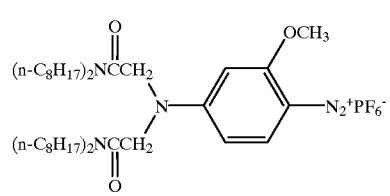

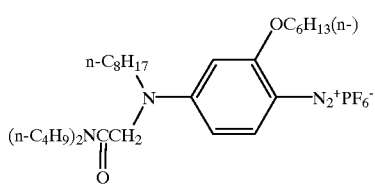

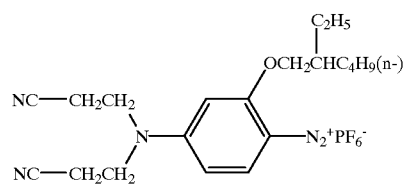

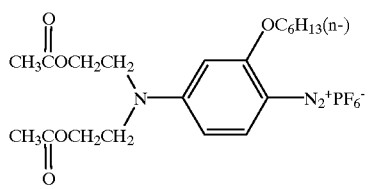

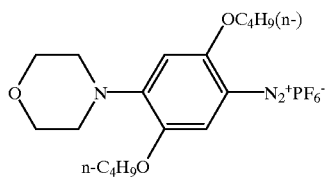

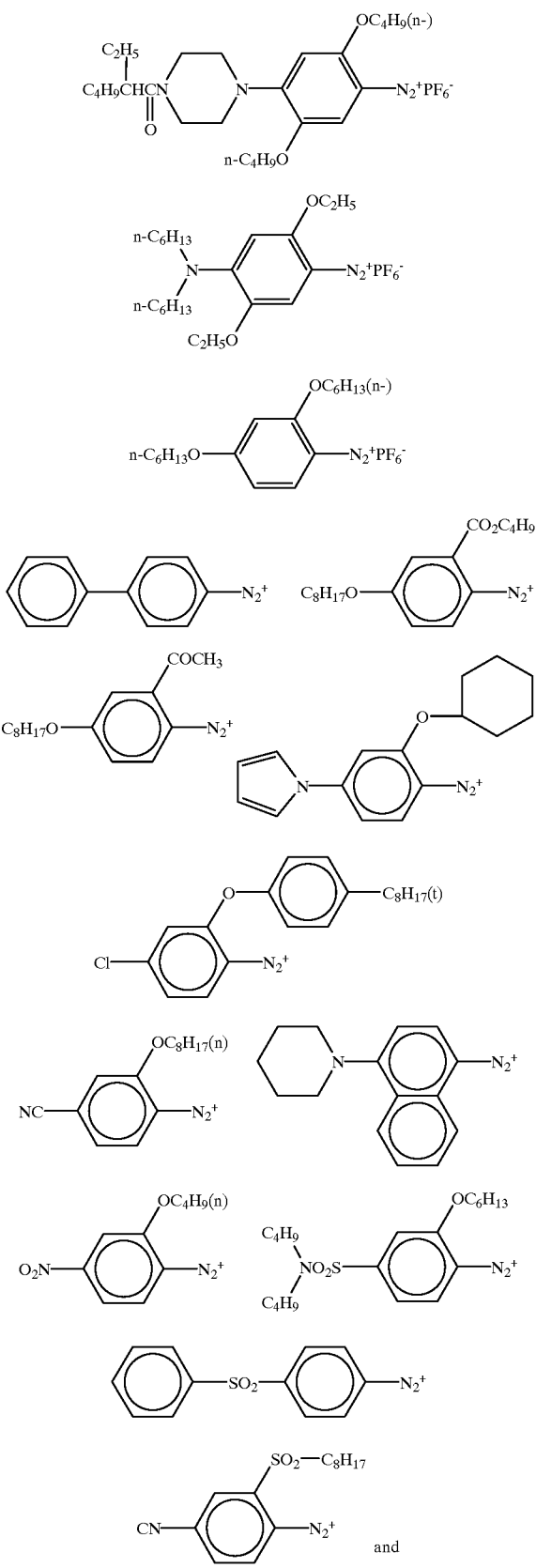

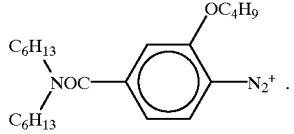

In the present invention, a single diazonium salt compound may be used or two or more kinds may be used in accordance with the purposes such as hue adjustment and the like.

The amount of the diazonium salt compound used in the light- and heat-sensitive transfer layer is preferably 0.01 to 3 g/m$^2$ and more preferably 0.02 to 1.0 g/m$^2$. When the amount of the diazonium salt compound used is less than 0.01 g/m$^2$, sufficient color forming ability cannot be obtained. When the amount of the diazonium salt compound exceeds 3 g/m$^2$, it is not preferable because sensitivity may be decreased and the fixing time may become longer.

The substantially colorless compound B, which is used in the light- and heat-sensitive transfer layer and has, within the same molecule, a polymerizable group and a moiety which reacts with the color forming component A to form color, may be any compounds as long as it reacts with the color forming component A (such as an electron accepting compound having a polymerizable group or a coupler compound having a polymerizable group or the like) to form color, and reacts with light to be polymerized and cured.

An electron accepting compound having a polymerizable group, i.e., a compound having an electron accepting group and a polymerizable group in the same molecule may be any compounds as long as it has a polymerizable group and reacts with the electron donating colorless dye, which is one of color forming components A, to form color and is able to cure the film by photopolymerization.

Examples of the electron accepting compound having a polymerizable group are compounds which are able to be synthesized with reference to the following compounds: 3-halo-4-hydroxybenzoic acid ester disclosed in JP-A No. 4-226455; methacryloxyethylester and acryloxyethylester of benzoic acid having a hydroxy group disclosed in JP-A No. 63-17368; ester of benzoic acid having a hydroxy group and hydroxymethylstyrene disclosed in JP-A Nos. 59-83693, 60-141587 and 62-99190; hydroxystyrene disclosed in EP Patent No. 29323; N-vinyl imidazol complex of zinc halide disclosed in JP-A Nos. 62-167077 and 62-16708; an electron accepting compound disclosed in JP-A No. 63-317558; and the like.

Among these compounds having an electron accepting group and a polymerizable group in the same molecule, 3-halo-4-hydroxybenzoic acid ester represented by the following formula is preferable.

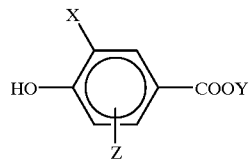

wherein X represents a halogen atom and preferably a chlorine atom. Y represents a monovalent group having a polymerizable ethylene group. An aralkyl group having a vinyl group, an acryloyloxyalkyl group having a vinyl group or a methacryloyloxyalkyl group having a vinyl group is preferable. An acryloyloxyalkyl group having 5–11 carbon atoms or a methacryloyloxyalkyl group having 6–12 carbon atoms is more preferable. Z represents a hydrogen atom, an alkyl group or an alkoxy group.

As the electron accepting compound having a polymerizable group, 3-halo-4-hydroxy benzoate ester or the like may be used. Specific examples of 3-halo-4-hydroxy benzoate ester or the like include compounds disclosed from seventh line from the bottom of page 48 to page 50, line 17 in U.S. Ser. No. 09/448,829.

The electron accepting compound having a polymerizable group is used in combination with the electron donating colorless dye.

In this case, the electron accepting compound is preferably used in the range from 0.5 to 20 parts by weight and more preferably in the range from 3 to 10 parts by weight per 1 part by weight of the electron donating colorless dye to be used. When the amount of the electron accepting compound is less than 0.5 parts by weight, sufficient color forming density cannot be obtained, and an amount of the electron accepting compound of more than 20 parts by weight is not preferable because sensitivity is decreased and the coating characteristic deteriorates.

The coupler compound having a polymerizable group used in the light- and heat-sensitive transfer layer may be any compounds as long as it has a polymerizable compound and reacts with the diazonium salt compound which is one of the color forming components A to form color, and can cure the film by photopolymerization.

The coupler compound is coupled to a diazo compound under a basic atmosphere and/or a neutral atmosphere so as to form the dye. Plural types of the coupler compounds can be used in accordance with various purposes such as the hue adjustment and the like.

Specific examples of the coupler compound include, but are not limited to, compounds disclosed from pages 52–57 of U.S. Ser. No. 09/448,829 (i.e., compounds B-1 to B-33).

The coupler compound may be added to the light- and heat-sensitive transfer layer in the range from 0.02 to 5 g/m$^2$ and more preferably in the range from 0.1 to 4 g/m$^2$ in view of the effect. An added amount of less than 0.02 g/m$^2$ is not preferable because the color forming ability deteriorates, and an added amount exceeding 5 g/m$^2$ is not preferable because the coating characteristic deteriorates.

The coupler compound is used in combination with the diazonium salt compound.

In this case, the coupler compound is preferably used in the range from 0.5 to 20 parts by weight and more preferably in the range from 1 to 10 parts by weight per 1 part by weight of the diazonium salt compound. When the amount of the coupler compound is less than 0.5 parts by weight, sufficient color forming ability cannot be obtained, and an amount of the coupler compound of more than 20 parts by weight is not preferable because the coating characteristic deteriorates.

The coupler compound may be used by adding a water soluble polymer together with other components and solid-dispersing by a sand mill or the like. Also, the coupler compound may be used as an emulsion by being emulsified together with an appropriate emulsion aid. The method of solid-dispersing or emulsifying is not especially limited and conventional known methods may be used. Details of such methods are disclosed in JP-A Nos. 59-190886, 2-141279, and 7-17145.

In the present invention, in order to accelerate the coupling reaction, organic bases such as tertiary amines, piperidines, piperazines, amidines, formamidines, pyridines, guanidines, morpholines and the like are preferably used.

Specifically, these organic bases are disclosed in JP-A Nos. 57-123086, 60-49991, 60-94381, 9-71048, 9-77729, and 9-77737 and the like.

The amount of the organic base used is not especially limited, but is preferably 1 to 30 mol per 1 mol of the diazonium salt compound.

Moreover, in order to accelerate the color forming reaction, a color forming aid may be added.

Examples of the color forming aid include phenol derivatives, naphotol derivatives, alkoxy substituted benzenes, alkoxy substituted naphthalenes, hydroxy compounds, amide carboxylate compounds, sulfonamide compounds and the like.

These compounds have functions of decreasing the melting point of the coupler compound or the basic substance, or of enhancing the thermal-permeability of the microcapsule wall, and thus, are considered to be compounds by which high color forming density can be obtained.

In the present invention, as the compound which reacts with the color forming component A to form color, instead of the compound B having a polymerizable group, the substantially colorless compound C which does not have a polymerizable group and which reacts with the color forming component A to form color may be used.

As the compound C does not have a polymerizable group, in order to have the recording layer cure by photopolymerization, the compound D having a polymerizable group may be used. As the compound D, an appropriate compound D, i.e., a specific photo-polymerizable monomer (D1 or D2) is selected in accordance with the compound C to be used.

As the compound C, any electron accepting compound or coupler compound which does not have a polymerizable group can be used.

As the electron accepting compound which does not have a polymerizable group, any electron accepting compound may be used as long as it reacts with the electron donating colorless dye which is one of color forming components A to form color.

Examples of the electron accepting compound which does not have a polymerizable group include phenol derivatives, salycylic acid derivatives, metal salts of aromatic carboxylic acid, acid clay, pentonite, novolak resin, metal treated novolak resin, metal complexes, and the like.

Specific examples of the electron accepting compound which does not have a polymerizable group are disclosed in Japanese Patent Publication (JP-B) Nos. 40-9309, 45-14039, JP-A Nos. 52-140483, 48-51510, 57-210886, 58-87089, 59-11286, 60-176795 and 61-95988, and the like.

Other specific examples of the electron accepting compound which does not have a polymerizable group are disclosed from paragraph 0109 to paragraph 0110 in Japanese Patent Application No. 11-36308 and the like.

The amount to be used of the electron accepting compound which does not have a polymerizable group is preferably 5 to 1000% by weight based on the amount to be used of the electron donating colorless dye.

When the electron accepting compound which does not have a polymerizable group is used, the compound D, i.e., the specific photo-polymerizable monomer D1, is used. The photo-polymerizable monomer D1 is preferably a photopolymerizable monomer which has a reaction inhibiting function for inhibiting the reaction between the electron donating colorless dye and the electron accepting compound and has at least one vinyl group within the molecule thereof.

Specific examples of the photo-polymerizable monomer D1 include acrylic acid and salts thereof, acrylate esters, acrylamides; methacrylic acid and salts thereof, methacrylate esters, methacrylamides; anhydrous maleic acid, maleate esters; itaconic acid, itaconate esters; styrenes; vinyl ethers; vinyl esters; N-vinyl heterocyclic rings; arylethers; allylesters and the like.

Among the aforementioned monomers, in particular, a photo-polymerizable monomer having a plurality of vinyl groups within the molecule is preferably used. Examples of such a photo-polymerizable monomer include acrylate esters and methacrylate esters of polyhydric alcohols such as trimethylolpropane and pentaerythritol and the like; acrylate esters and methacrylate esters of polyhydric phenols such as resorcinol, pyrogallol, phloroglucinol and the like and bisphenols; and acrylate-terminated or methacrylate-terminated epoxy resin, acrylate-terminated or methacrylate-terminated polyester and the like.

Among the aforementioned monomers, ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate and diethylene glycol dimethacrylate and the like are especially preferable.

The molecular weight of the photo-polymerizable monomer D1 is preferably about 100 to about 5000 and more preferably about 300 to about 2000.

The photo-polymerizable monomer D1 is used preferably in the range from 0.1 to 10 parts by weight and more preferably in the range from 0.5 to 5 parts by weight per 1 part by weight of the substantially colorless compound C which reacts with the color forming component A to form color. When the amount of the monomer is less than 0.1 parts by weight, a latent image cannot be formed in the exposure step, and an amount of the monomer exceeding 10 parts by weight is not preferable because the color forming density is decreased.

Any coupler compounds which do not have a polymerizable group may be used as long as they react with the diazonium salt compound, which is one of color forming components A, so as to form color.

The coupler compound which does not have a polymerizable group is a compound which couples with a diazonium salt compound under a basic atmosphere and/or a neutral atmosphere to form a dye. Plural kinds of coupler compounds can be used in combination in accordance various purposes such as hue adjustment and the like.

Examples of the coupler compound which does not have a polymerizable group include a so-called active methylene compound which has a methylene group adjacent to a carbonyl group, phenol derivatives, naphthol derivatives and the like. The coupler compound which does not have a polymerizable group is appropriately selected within the range corresponding to the purpose of the present invention.

Specific examples of the coupler compound which does not have a polymerizable group include resorcin,
phloroglucin,
2,3-dihydroxynaphthalene,
sodium 2,3-dihydroxynaphthalene-6-sulfonate,
1-hydroxy-2-naphthoic morpholinopropylamide,
sodium 2-hydroxy-3-naphthalenesulfonate,
2-hydroxy-3-naphthalenesulfonic anilide,
2-hydroxy-3-naphthalenesulfonic morpholinopropylamide,
2-hydroxy-3-naphthalenesulfonic-2-ethylhexyloxypropylamide,
2-hydroxy-3-naphthalenesulfonic-2-ethylhexylamide,
5-acetamide-1-naphthol,
sodium 1-hydroxy-8-acetamidenaphthalene-3,6-disulfonate,
1-hydroxy-8-acetamidenaphthalene-3,6-disulfonic dianilide,
1,5-dihydroxynaphthalene,
2-hydroxy-3-naphthoic morpholinopropylamide,
2-hydroxy-3-naphthoic octylamide, 2-hydroxy-3-naphthoic anilide,
5,5-dimethyl-1,3-cyclohexanedione,
1,3-cyclopentanedione,
5-(2-n-tetradecyloxyphenyl)-1,3-cyclohexanedione,
5-phenyl-4-methoxycarbonyl-1,3-cyclohexanedione,
5-(2,5-di-n-octyloxyphenyl)-1,3-cyclohexanedione,
N,N'-dicyclohexylbarbituric acid, N,N'-di-n-dodecylbarbituric acid,
N-n-octyl-N'-n-octadecylbarbituric acid,
N-phenyl-N'-(2,5-di-n-octyloxyphenyl)barbituric acid,
N,N'-bis(octadecyloxycarbonylmethyl)barbituric acid,
1-phenyl-3-methyl-5-pyrazolone,
1-(2,4,6-trichlorophenyl)-3-anilino-5-pyrazolone,
1-(2,4,6-trichlorophenyl)-3-benzamide-5-pyrazolone,
6-hydroxy-4-methyl-3-cyano-1-(2-ethylhexyl)-2-pyridone,
2,4-bis-(benzoylacetamide)toluene,
1,3-bis-(pivaloylacetamidemethyl)benzene, benzoylacetonitrile,
thenoylacetonitrile, acetacetanilide, benzoylacetanilide, pivaloylacetanilide,
2-chloro-5-(N-n-butylsulfamoyl)-1-pivaloylacetamidebenzene,
1-(2-ethylhexyloxypropyl)-3-cyano-4-methyl-6-hydroxy-1,2-dihydropyridine-2-one,
1-(dodecyloxypropyl)-3-acetyl-4-methyl-6-hydroxy-1,2-dihydropyridine-2-one,
1-(4-n-octyloxyphenyl)-3-tert-butyl-5-aminopyrazole and the like.

Coupler compounds which do not have a polymerizable group are disclosed in JP-A Nos. 4-201483, 7-223367, 7-223368, 7-323660, 5-278608, 5-297024, 6-18669, 6-18670, 7-316280 and the like. Reference can also be made to JP-A Nos. 9-216468, 9-216469, 9-319025, 10-35113, 10-193801, 10-264532 co-pended in the name of the same assignee of the present application.

The coupler compound which does not have a polymerizable group is added in the light- and heat-sensitive transfer layer, as in the case of the coupler compound having a polymerizable group, preferably at the range from 0.02 to 5 g/m$^2$ and more preferably at the range from 0.1 to 4 g/m$^2$ in view of the effect. When the added amount is less than 0.02 g/m$^2$, sufficient color forming density cannot be obtained. When the added amount exceeds 5 g/m$^2$, it is not preferable because the coating characteristic may deteriorate.

The coupler compound may be used by adding a water soluble polymer together with other components and solid-dispersing by a sand mill or the like. Also, the coupler compound may be used as an emulsion by being emulsified together with an appropriate emulsion aid. The method of solid-dispersing or emulsifying is not especially limited and conventional known methods may be used. Details of such methods are disclosed in JP-A Nos. 59-190886, 2-141279, and 7-17145.

In order to accelerate the coupling reaction, organic bases such as tertiary amines, piperidines, piperazines, amidines, formamidines, pyridines, guanidines, morpholines and the like are preferably used.

The organic bases used here are the same bases as those used in the case of the coupler compound having a polymerizable group. The amount of organic bases to be used is also the same.

With regard to color forming aids which are used in order to accelerate the color forming reaction, the same ones as those in the case of the coupler compound having the polymerizable group can be used.

When the coupler compound which does not have a polymerizable group is used, the compound D, i.e., the specific photo-polymerizable monomer D2, is used in combination with the coupler compound. The photo-polymerizable monomer D2 is preferably a photo-polymerizable monomer which has an acid group having an inhibitory effect on the coupling reaction and which is not a metallic salt compound.

Examples of the photo-polymerizable monomer D2 include monomers disclosed from page 45, line 22 to page 47, line 4 in U.S. Ser. No. 09/448,829.

The amount to be used of the photo-polymerizable monomer D2 is preferably 0.1 to 10 parts by weight and more preferably 0.5 to 5 parts by weight per 1 part by weight of the substantially colorless compound C which reacts with the color forming component A to form color. When the amount of the photo-polymerizable monomer D2 is less than 0.1 parts by weight, it is impossible to form a latent image in the exposure step and when the amount of the photo-polymerizable monomer D2 is more than 10 parts by weight, it is not preferable because the color forming density may be decreased.

Next, the photoinitiator used in the light- and heat-sensitive transfer layer of the light- and heat-sensitive transfer material of the present invention will be explained.

The photoinitiator is used in both of the light- and heat-sensitive transfer materials (a) and (b). The photoinitiator can generate radicals by exposure to light and cause the polymerization reaction within the layer. Further, the photoinitiator can accelerate the polymerization reaction. The recording layer film is cured by the polymerization reaction and a latent image of the desired image shape can be formed.

The photoinitiator preferably contains a spectral sensitization compound which has a maximum absorption wavelength in the range from 300 to 1000 nm and a compound which interacts with the spectral sensitization compound. However, if the compound which interacts with the spectral sensitization compound is a compound which has, within its structure, both functions of a dye moiety having a maximum absorption wavelength in the range from 300 to 1000 nm and of a borate moiety, the spectral sensitization compound is unnecessary.

The image recording method of the present invention is an image recording method using the light- and heat-sensitive transfer material which has the light- and heat-sensitive transfer layer containing the photoinitiator which comprises the spectral sensitization compound and the compound which interacts with the spectral sensitization compound.

As the spectral sensitization compound having a maximum absorption wavelength at 300 to 1000 nm, a spectral sensitization compound having a maximum absorption wavelength in this wavelength range is preferable. High sensitivity can be obtained by selecting any desired dye from among spectral sensitization dyes at the aforementioned wavelength range and adjusting the light-sensitive wavelength to correspond to the light source to be used. The light source for image exposure can be appropriately selected from blue, green and red light sources and infrared lasers and the like.

Accordingly, for example, in a case in which a color image is formed by using a multicolor light- and heat-sensitive transfer material formed by superposing monochrome light- and heat-sensitive transfer layers each of which forms color to a different hue, spectral sensitization dyes having different absorption wavelengths exist in the respective monochrome layers having different color forming hues. By using a light source corresponding to the absorption wavelengths, because each layer (each color) has high sensitivity in the recording material formed by superposing a plurality of layers and an image with high sharpness can be formed, sensitivity enhancement and sharpness enhancement can be achieved for the whole multicolor light- and heat-sensitive transfer material.

Known compounds may be used as the spectral sensitization dye.

Specific examples of the spectral sensitization dye include dyes disclosed in patent publications about *Compounds which Interact with Spectral Sensitization Compounds* which will be described later, *Research Disclosure,* Vol. 200, December, 1980, Item 20036 and *Sensitizer,* edited by Katsumi Tokumaru and Shin Ogawara, published by Kodansha Ltd. Publishers, pp. 160–163 (1987) and the like.

Specifically, 3-ketocumarin compound disclosed in JP-A No. 58-15603, thiopyrylium salt disclosed in JP-A No. 58-40302, naphthothiazol merocyanine compounds disclosed in JP-B Nos. 59-28328 and 60-53300, merocyanine compounds disclosed in JP-B Nos. 61-9621, 62-3842, 59-89303 and 60-60104 may be used.

Moreover, dyes described in *Chemistry of Functional Dyes,* published by CMC Publishers, pp. 393–416 (1981) and *Color Materials,* 60(4) 212–224 (1987), and the like may also be used. Specific examples are cation methine dye, cation carbonium dye, cation quinone imine dye, cation indoline dye, cation styryl dye and the like.

Examples of the spectral sensitization dye include keto dyes such as cumarin (including ketocumarin or sulfonocumarin) dye, merostyryl dye, oxonol dye, hemioxonol dye and the like; non-keto dyes such as non-ketopolymethine dye, triarylmethane dye, xanthene dye, anthracene dye, rohodamine dye, acridine dye, aniline dye, azo dye and the like; non-ketopolymethine dyes such as azomethine dye, cyanine dye, carbocyanine dye, dicarbocyanine dye, tricarbocyanine dye, hemicyanine dye, styryl dye and the like; and quinone imine dyes such as azine dye, oxazine dye, thazine dye, quinoline dye, thiazol dye and the like.

By appropriately using the spectral sensitization dye, the spectral sensitivity of the photoinitiator used with the light- and heat-sensitive transfer material of the present invention can be obtained in the range from UV light to infrared light.

Any of various spectral sensitization compound may be used alone or in combination of two or more kinds.

The amount of the spectral sensitization dye used in the light- and heat-sensitive transfer layer is preferably 0.1 to 5% by weight and more preferably 0.5 to 2% by weight based on the total weight of the light- and heat-sensitive transfer layer.

One or two or more kinds of compounds, which are able to start the photopolymerization reaction of a polymerizable group in the compound B or the compound D (i.e., photo-polymerizable monomer), may be selected and used as the compound which interacts with the spectral sensitization compound. In particular, when the compound coexists with the spectral sensitization compound, the compound becomes sensitive to the light source for exposure in the spectral absorption wavelength range of the spectral sensitization compound with efficiency. Accordingly, sensitivity enhancement can be achieved and the generation of radicals can be controlled by using an arbitrary light source within the range from ultraviolet to infrared.

Specific examples of the compound which interacts with the spectral sensitization compound include organic borate salt compounds or compounds disclosed from page 22, line 17 to page 23, line 17 in U.S. Ser. No. 09/448,829.

Among "compounds which interact with the spectral sensitization compound", organic borate compounds, benzoinethers, S-triazine derivative having a trihalogen substituted methyl group, organic peroxides or azinium salt compounds are preferable and organic borate compounds are more preferable.

By using the spectral sensitization compound and the "compound which interacts with the spectral sensitization compound" at the same time, at the time of exposure, radicals can be locally and efficiently generated at the exposed portions, and sensitivity enhancement can be achieved.

Examples of the organic borate compounds include organic borate compounds (which may be referred to as "borate compound I" hereinafter) disclosed in JP-A Nos. 62-143044, 9-188685, 9-188686, 9-188710 and the like, or spectral sensitization dye-based borate compounds (which may be referred to as "borate compound II" hereinafter) obtained from cation dyes and the like.

Specific examples of the borate compound I include, but are not limited to, compounds disclosed on pages 25–30 of U.S. Ser. No. 09/448,829 (i.e., compounds I-(1) to I-(36)).

In the light- and heat-sensitive transfer material of the present invention, the spectral sensitization dye-based organic borate compounds (i.e., borate compound II) obtained from cation dyes disclosed in *Chemistry of Functional Dyes,* (published by CMC Publishers, pp. 393–416 (1981)) and *Color Materials,* (60 (4) 212–224 (1987)) and the like may be used.

The borate compound II is a compound which has a dye moiety and a borate moiety within its structure, and has the following three functions. Firstly, at the time of exposure, the compound efficiently absorbs the light source energy by the light absorbing function of the dye moiety. Secondly, it promotes the polymerization reaction by the radical emitting function of the borate moiety. Thirdly, the compound decolorizes the spectral sensitization compound coexisting therewith.

Specifically, any cation dyes may be appropriately used as long as they have a maximum absorption wavelength in the wavelength range of 300 nm or more, or in the wavelength range of 400 to 1100 nm. Among the cation dyes, cation methine dye, polymethine dye, triaryl methane dye, indrine dye, azine dye, xanthene dye, cyanine dye, hemicyanine dye, rhodamine dye, azamethine dye, oxadine dye or acridine dye and the like are preferable. Cation cyanine dye, hemicyanine dye, rhodamine dye, or azamethine dye are more preferable.

The borate compound II obtained from an organic cation dye can be obtained by using an organic cation dye and an organic boron compound anion with reference to the method disclosed EP Patent No. 223,587A1. Specific examples of the borate compound II obtained from the cation dye include, but are not limited to, compounds disclosed on pages 32–38 of U.S. Ser. No. 09/448,829 (i.e., compounds II (1) to II-(31)).

As described above, the borate compound II is a multi-functional compound. In view of obtaining high sensitivity and sufficient decolorizability, in the light- and heat-sensitive transfer material of the present invention, it is preferable that the photoinitiator is formed by appropriately combining the spectral sensitization compound and the compound which interacts with the spectral sensitization compound.

In this case, the photoinitiator is more preferably a photoinitiator (1) by the combination of the spectral sensitization compound and borate compound I, or more preferably a photoinitiator (2) obtained by the combination of borate compound I and borate compound II.

The usage ratio of the spectral sensitization dye to the organic borate compound in the photoinitiator is very important in view of obtaining sensitivity enhancement and sufficient decolorizability due to irradiation of light in the fixing step.

In a case of the photoinitiator (1), in the photoinitiator, in addition to the ratio of the spectral sensitization compound/borate compound I (=1/1:mole ratio) necessary for the photopolymerization reaction, it is especially preferable that an amount of borate compound I necessary for sufficiently decolorizing the spectral sensitization compound which remains within the layer is added in view of obtaining sensitivity enhancement and decolorizability due to irradiation of light.

Namely, the ratio of the spectral sensitization dye/borate compound I is preferably 1/1 to 1/50, more preferably 1/1.2 to 1/30 and most preferably 1/1.2 to 1/20. When the ratio is less than 1/1, the polymerization reactivity and the decolorizability cannot be sufficiently obtained. When the ratio is more than 1/50, it is not preferable because the coating characteristic may deteriorate.

In a case of the photoinitiator (2), it is especially preferable that borate compound I and borate compound II are used in combination such that the borate moiety is in an equimolar ratio or more with respect to the dye moiety in view of obtaining sufficient sensitivity enhancement and decolorizability.

The ratio of the borate compound I/borate compound II is preferably 1/1 to 50/1, more preferably 1.2/1 to 30/1 and most preferable 1.2/1 to 20/1. If the ratio is less than 1/1, few radicals are generated, so that sufficient polymerization reactivity and decolorizability cannot be obtained. When the ratio exceeds 50/1, it is preferable because sensitivity cannot be sufficiently obtained.

The total amount of the spectral sensitization dye and the organic borate compound in the photoinitiator is preferably 0.1 to 10% by weight and more preferably 0.1 to 5% by weight and most preferably 0.1 to 1% by weight based on the amount used of the compound having a polymerizable group. When the total amount is less than 0.1% by weight, the effect of the present invention cannot be obtained. When the total amount is more than 10% by weight, it is not preferable because the storage stability may be decreased and the coating characteristic may also be decreased.

In order to accelerate the polymerization reaction, as an assistant, an oxygen scavenger or a reducing agent such as a chain transfer agent of an active hydrogen donor, or another compound which accelerates the polymerization in a chain-transfer manner may be added in the photopolymerizable composition in the light- and heat-sensitive transfer layer in the image recording method of the present invention.

Examples of the oxygen scavenger include phosphine, phosphonate, phosphite, silverous salt, or other compounds easily oxidized by oxygen.

Specific examples of the oxygen scavenger include N-phenylglycine, trimethylbarbituric acid, N,N-dimethyl-2,6-diisopropylaniline, and N,N,N-2,4,6-pentamethylanilinic acid and the like. Examples of useful polymerization accelerators include thiols, thioketones, trihalomethyl compounds, lophine dimer compounds, iodonium salts, sulfonium salts, azinium salts, organic peroxides, and azides and the like.

The light- and heat-sensitive transfer material which is applicable to the image recording method of the present invention is not limited to the light- and heat-sensitive transfer materials (a) and (b) and may have any of various structures in accordance with the purpose therefor. Further, the light- and heat-sensitive transfer material may be monochrome or may be multicolor.

In the light- and heat-sensitive transfer material used in the present invention, the heat-bonding layer must be provided as the outermost layer on the light- and heat-sensitive transfer layer. The heat-bonding layer (heat-sensitive bonding layer) contains a heat-sensitive adhesive so as to, when heated, generate heat and adhere to an image receiving material.

As the heat-sensitive adhesive contained in the heat-sensitive bonding layer, any adhesive may be used as long as it contains components which exhibit adhesive property upon heating. Examples of the heat-sensitive adhesive include heat-melting compounds, thermoplastic resins, and the like. Examples of heat-melting compounds include low molecular products of thermoplastic resins such as polystyrene resin, acryl resin, styrene-acryl resin, polyester resin, polyurethane resin and the like, and various waxes such as plant-based waxes such as carnauba wax, Japan wax, candelilla wax, rice wax, ouricury wax, and the like, animal-based waxes such as bees wax, insect wax, shellac, whale wax and the like, petroleum-based waxes such as paraffin wax, microcrystalline wax, polyethylene wax, Fischer-Tropsch wax, ester wax, oxide wax and the like, mineral-based waxes such as montan wax, ozokerite, ceresin wax and the like. Further, rosin derivatives such as rosin, hydrogenated rosin, polymerized rosin, rosin modified glycerin, rosin modified maleic acid resin, rosin modified polyester resin, rosin modified phenol resin, ester gum and the like, phenol resin, terpene resin, ketone resin, cyclopentadiene resin, aromatic hydrocarbon resin, aliphatic hydrocarbon resin, alicyclic hydrocarbon resin and the like may be used.

These heat-melting compounds preferably have a molecular weight of 10,000 or less in general, and in particular 5,000 or less, and preferably have a melting point or softening point of 50 to 150° C. These heat melting compounds may be used alone, or two or more kinds of heat melting compounds may be used.

Examples of the thermoplastic resin include vinyl acetate-based resin, polyvinyl alcohol, polyvinylacetal-based resin, polyvinylether-based resin, ethylene-based copolymer, polyamide resin, polyester resin, polyurethane resin, polyolefin-based resin, acryl-based resin and cellulose-based resin and the like. Among these resins, in particular, an ethylene-based copolymer or the like is appropriately used.

Examples of the ethylene-based copolymer include ethylene-vinyl acetate copolymer, ethylene-ethylacrylate resin, ethylene-vinyl acetate-anhydride maleic acid resin, ethylene-acrylic acid resin, ethylene-methacrylic acid resin, ethylene-αolefin copolymer and the like. Among these, ethylene-vinyl acetate copolymer or ethylene-vinyl acetate-based copolymer such as ethylene-vinyl acetate copolymer, ethylene-ethylacrylate resin and ethylene-vinyl acetate-anhydride maleic acid resin; and ethylene-ethylacrylate resin or ethylene-ethylacrylate-based resin are preferable. Ethylene-vinyl acetate copolymer and the like are particularly preferable.

In these various ethylene-based copolymers, the added amount of the comonomer unit other than the ethylene unit is preferably 28% by weight or more and particularly preferably 35% by weight or more. By using, as the thermoplastic resin or a main component thereof, an ethylene-vinyl acetate-based copolymer such as ethylene-vinyl acetate copolymer and/or an ethylene-ethyl acrylate-based resin such as -ethyl acrylate resin, which have the aforementioned specific composition, the adhesive force can be further enhanced with respect to a transferred member having a low surface smoothness, and significantly high fixability of the image portion after image formation can be realized.

The melt index (MI value) of the thermoplastic resin is usually in the range from 2 to 1500 and preferably in the range from 20 to 500. When a thermoplastic resin whose MI value is in the above-described ranges is used, the adhesive force of the heat-sensitive adhesive with respect to the transferred member can be improved. The thermoplastic resin may be used alone, or two or more kinds of thermoplastic resins may be used.

The heat-bonding layer of the light- and heat-sensitive transfer material of the present invention preferably contains these heat melting compounds and/or thermoplastic resin as a main component, and the added amount thereof is, for example, 50 to 100% by weight and more preferably 70 to 100% by weight. When the added amount is too small, sufficient adhesive strength cannot be obtained and image defects such as deficient transfer and the like may be caused, and thus, overly small amounts are not preferable.

Other known added components, for example, tackifiers, antioxidants, flame retarders, fillers, matte agents, metallic soaps, surfactants, antistatic agents, coloring agents, fluorescent whitening agents and the like may be appropriately added to the heat-bonding layer of the light- and heat-sensitive transfer material of the present invention, if desired, provided that they are added in amounts within the scope of not adversely affecting the effects of the present invention. The film thickness of the heat-bonding layer is usually 0.2 to 5.0 μm and particularly preferably 0.5 to 4.0 μm. It is necessary to provide at least one heat-bonding layer, but the heat-bonding layer may be formed by two or more layers, each of which has different types of or contained amounts of color materials or has a different compounding ratio of the thermoplastic resin to the heat melting compound.

A protective layer may be provided in the light- and heat-sensitive transfer material used with the present invention, if desired, at a position which is adjacent to the support and which becomes the outermost layer after transfer.

The protective layer may be a single layer structure or may be a laminated structure of two or more layers.

Examples of materials used for the protective layer include water soluble polymer compounds such as gelatin, polyvinyl alcohol, carboxy modified polyvinyl alcohol, vinyl acetate-acrylamide copolymer, silicon modified polyvinyl alcohol, starch, modified starch, methylcellulose, carboxymethylcellulose, hydroxymethylcellulose, gelatins, gum arabic, caseine, styrene-maleic acid copoymer hydrolysate, styrene-maleic acid copolymer half ester hydrolysate, isobutylene-maleic anydride copolymer hydrolysate, polyacrylamide derivatives, polyvinylpyrolidone, polystyrene sodium sulfonate, sodium alginate and the like; latexes such as styrene-butadiene rubber latex, acrylonitrile-butadiene rubber latex, methyl acylate-butadiene rubber latex, vinyl acetate emulsion and the like.

By cross-linking the water soluble polymer used for the protective layer, the storage stability can be further enhanced. In this case, known cross-linking agents may be used as the cross-linking agents for cross-linking. Specific examples of the cross-linking agents include water soluble initial condensates such as N-methylolurea, N-methylolmelamine, urea-formaline and the like, dialdehyde compounds such as glyoxal, glutalaldehyde and the like, inorganic-based cross-lining agents such as boric acid, borax and the like, polyamide epichlorohydrine and the like.

Further, known pigments, metal soap, wax, surfactants, and the like may be used in the protective layer. Known UV absorbents and UV absorbent precursors may be added.

The coated amount of the protective layer is preferably 0.2 to 5 $g/m^2$ and more preferably 0.5 to 3 $g/m^2$.

In a case of the multicolor light- and heat-sensitive transfer material, the multicolor light- and heat-sensitive transfer material may be structured such that a plurality of monochrome light- and heat-sensitive transfer layers are superposed on a support, and the light- and heat-sensitive transfer layers contain microcapsules which contain color forming components having different color forming hues and a photo-polymerizable composition which is sensitive to lights of different wavelengths. By using the spectral sensitization compounds each of which has a different absorption wavelength, a photo-polymerizable composition which is sensitive to lights of different wavelengths can be formed. In this case, an intermediate layer may be provided between the monochrome light- and heat-sensitive transfer layers.

The light- and heat-sensitive transfer layer of the multicolor and multilayer light- and heat-sensitive transfer material used with the method of the present invention may be, for example, formed as follows.

On a support is provided a first recording layer (transfer layer) containing microcapsules which contain a color forming component which forms the color yellow and a photo-polymerizable composition which is sensitive to a central wavelength $\lambda_1$ of a light source. On the first recording layer is provided a second recording layer which contains microcapsules containing a color forming component which forms the color magenta and a photo-polymerizable composition which is sensitive to a central wavelength $\lambda_2$ of a light source. On the second recording layer is provided a third recording layer containing microcapsules which contain a color forming component which forms the color cyan and a photo-polymerizable composition which is sensitive to a wavelength $\lambda_3$. The light- and heat-sensitive transfer layer may be formed such that an intermediate layer is provided between the respective recording layers, if desired.

When the image forming is carried out by using the light- and heat-sensitive transfer material having the aforementioned multicolor and multilayer light- and heat-sensitive transfer layer, in the exposure step, the image exposure is carried out by using a plurality of light sources having different wavelengths corresponding respectively to the absorption wavelengths of the layers in the light- and heat-sensitive transfer layer structure. As a result, recording layers having absorption wavelengths of the light sources selectively form respective latent images, and therefore, a multicolor image with high sensitivity and high sharpness can be formed. Moreover, by irradiating the surface of the light- and heat-sensitive transfer layer with light after being transferred to an image receiving material, the coloring of the background portion due to the photoinitiator (such as the spectral sensitization compound) which remains within the layers can be decolorized so that an image with high contrast and high quality can be formed.

In the light- and heat-sensitive transfer material of the present invention, the electron donating colorless dye or the diazonium salt compound to be used (which may be appropriately referred to as the "color forming component" hereinafter) is encapsulated in microcapsules. Examples of the method of microencapsulating include conventionally known methods.

Examples of these microencapsulation methods include methods described in U.S. Pat. Nos. 2,800,457 and 2,800,458 in which the coaservation of a hydrophilic wall forming is utilized; U.S. Pat. No. 3,287,154 and UK Patent No. 990443, JP-B Nos. 38-19574, 42-446, 42-771 in which interfacial polymerization is utilized; U.S. Pat. Nos. 3,418,250 and 3,660,304 in which the precipitation of a polymer is utilized; U.S. Pat. No. 3,796,669 in which an isocyanate polyol wall material is utilized; U.S. Pat. No. 3,914,511 in which an isocyanate wall material is utilized; U.S. Pat. Nos. 4,001,140, 4,087,376, and 4,089,802 in which a urea/formaldehide type or urea/formaldehyde/resorcinol type wall forming material is used; and U.S. Pat. No. 4,025,455 in which a wall forming material such as a melamine/formaldehyde resin, hydroxypropyl cellulose or the like is utilized; JP-B No. 36-9168 and JP-A No. 51-9079 in which the in-situ methods using monomer polymerization are utilized; UK Patent Nos. 952807 and 965074 in which the electrophoretic dispersion and cooling method is utilized; U.S. Pat. No. 3,111,407 and UK Patent No. 930422 in which the spray drying method is utilized; and the like.

The microencapsulation methods are not limited to the aforementioned methods, but in the light- and heat-sensitive transfer material of the present invention, in particular, an interfacial polymerization method is preferably used in which an oil phase, which is prepared by dissolving or dispersing a color forming component in a hydrophobic organic solvent serving as the core of the capsule, is mixed with an aqueous phase in which a water soluble polymer is dissolved, and the mixture is emulsified and dispersed by a homogenizer or the like, and then the polymer forming reaction is caused at the oil droplet surface (i.e., the interface between the oil phase and the aqueous phase) by heating, so that the microcapsule wall of the polymer substance can be formed.

Namely, in the interfacial polymerization method, capsules with a uniform particle diameter can be formed within a short time, and a recording material with excellent storage ability can be obtained.

A reactant which forms a polymer is added within the oil droplet and/or outside the oil droplet. Specific examples of polymer materials include polyurethane, polyurea, polyamide, polyester, polycarbonate, urea-formaldehyde resin, melamine resin, polystyrene, styrene methacrylate copolymer, styrene-acrylate copolymer and the like. Among these, polyurethane, polyurea, polyamide, polyester, and polycarbonate are preferable, and polyurethane and polyurea are especially preferable. The above-mentioned polymer materials may be used in combination of two or more kinds.

Examples of the water soluble polymers include gelatin, polyvinyl pyrolidone, polyvinyl alcohol and the like.

For example, when a polyurethane is used as a capsule wall material, a microcapsule wall is formed as follows. Firstly, a polyhydric isocyanate and a second material (for example, polyol or polyamine) which reacts with the polyhydric isocyanate to form microcapsule walls, are mixed with each other in a water soluble polymer aqueous solution (aqueous phase) or in an oil medium (oil phase) whch is to be encapsulated. Then, the mixture is emulsified and dispersed. Finally, by heating, the polymer forming reaction is caused at the interface between the oil phase and the aqueous phase so that the microcapsule walls can be formed.

Examples of the polyhydric isocyanate and polyol and polyamine which react with the polyhydric isocyanate include materials disclosed in U.S. Pat. Nos. 3,281,383, 3,773,695, 3,793,268, JP-B Nos. 48-40347, 49-24159, JP-A Nos. 48-80191 and 48-84086.

In the present invention, when the microcapsules which contain the color forming component are prepared, the encapsulated color forming component may be present in the capsules in a liquid state or a solid state.

Examples of solvents which can be used are the same solvents as those used in the previously-described case of emulsifying and dispersing the photo-curable composition.

When the electron donating colorless dye or the diazonium salt compound is encapsulated in the capsules in a liquid state, the electron donating colorless dye or the diazonium salt compound is encapsulated in a state in which it is dissolved in a solvent. In this case, the amount of the solvent is preferably 1 to 500 parts by weight per 100 parts by weight of the electron donating colorless dye.

When the electron donating colorless dye or the diazonium salt compound to be encapsulated has low solubility with respect to the solvent, as auxiliary solvents, a low-boiling-point solvent having high solubility may be used. Examples of the low-boiling-point solvent include ethyl acetate, propyl acetate, isopropyl acetate, butyl acetate, methylene chloride and, the like.

On the other hand, an aqueous solution in which the water soluble polymer is dissolved is used as the aqueous phase. After charging the oil phase into the aqueous phase, the emulsifying-and-dispersing is carried out by a homogenizer or the like. The water soluble polymer enables uniform and easy dispersion as well as acts as a dispersion medium which stabilizes the emulsified and dispersed aqueous solution. Here, in order to carry out more uniform emulsifying-and-dispersing and the stabilization, a surfactant may be added to at least one of the oil phase or the aqueous phase. Known surfactants for emulsion can be used as surfactants. When a surfactant is added, the added amount of the surfactant is preferably 0.1% to 5% and more preferably 0.5% to 2% based on the weight of the oil phase.

As a surfactant contained in the aqueous phase, among anionic or nonionic surfactants, a surfactant which acts as a protective colloid and does not cause precipitation or aggregation can be appropriately selected and used.

Preferable examples of the surfactants include sodium alkyl benzene sulfonate, sodium alkyl sulfate, sodium salt of dioctyl sulfosuccinate, polyalkylene glycol (for example, polyoxyethylene nonylphenylether) and the like.

As described above, the water soluble polymer contained as the protective colloid in the aqueous phase mixed with the oil phase may be appropriately selected from known anionic polymers, nonioic polymers, and amphoteric polymers.

Examples of the anionic polymer include natural and synthetic polymers, and for example, polymers having —COO—, —SO$_2$— groups and the like.

Specific examples of the anionic polymer include natural polymers such as gum arabic, alginic acid, pectin and the like; semi-synthetic products such as carboxymethylcellulose, gelatin derivatives (for example, gelatin phthalate and the like), starch sulfate, cellulose sulfate, lignin sulfonic acid and the like; synthetic products such as maleic anhydride-based (including hydrolysates) copolymers, acrylic acid-based (methacrylic acid-based) polymers and copolymers, vinylbenzenesulfonic acid-based polymers and copolymers, carboxy modified polyvinylalcohols and the like.

Examples of the nonionic polymer include polyvinyl alcohol, hydroxyethyl cellulose, methyl cellulose, and the like.

Examples of the amphoteric polymer include gelatin and the like. Among them, gelatin, gelatin derivatives, and polyvinylalcohol are preferable.

The water soluble polymer is used as an aqueous solution of 0.01 to 10% by weight.

All contained components in the light- and heat-sensitive transfer layer such as the color forming component are used by being solid-dispersed together with, for example, a water soluble polymer, a sensitizer and other color forming aids and the like by the sand mill or the like. However, it is preferable that after dissolving a slightly soluble or insoluble high-boiling-point organic solvent in water in advance, the solution is mixed with the polymer aqueous solution (aqueous phase) containing the surfactant and/or the water soluble polymer as the protective colloid, and the mixed solution is used as an emulsified dispersion by using a homogenizer or the like. In this case, if necessary, a low-boiling-point solvent may be used as the dissolving aid.

Further, all components such as the aforementioned color forming component can be emulsified and dispersed separately or can be mixed together in advance and dissolved in a high-boiling-point solvent and dispersed and emulsified. The diameter of the particle formed by emulsifying and dispersing is preferably 1 $\mu$m or less.

The emulsifying can be easily carried out such that the oil phase containing the aforementioned components and the aqueous phase containing the protective colloid and the surfactant are mixed together, and the mixed solution is emulsified by using usual means for emulsifying particles such as high speed stirring, ultrasonic dispersing or the like, i.e., a known emulsifying device including a homogenizer, Manton-Gaulin, ultrasonic disperser, dissolver, kady mill or the like.

After emulsifying, in order to accelerate the capsule wall formation reaction, the emulsion is heated to 30 to 70° C. During the reaction, to prevent the aggregation of capsules, it is necessary to add water so as to decrease the probability of collision of capsules, or to stir thoroughly, or the like.

During the reaction, a dispersion for preventing aggregation may be separately added. It is observed that carbon dioxide is generated as the polymerization reaction proceeds. The capsule wall formation reaction proceeds until carbon dioxide is not generated. Usually, the microcapsules which encapsulate the desired dye are obtained by reacting a few hours.

The average particle diameter of the microcapsules used for the light- and heat-sensitive transfer material of the present invention is preferably 20 $\mu$m or less and more preferably 5 $\mu$m or less in view of obtaining high resolution. When the diameter of the formed microcapsules is too small, the surface area with respect to a fixed amount of solids becomes too large so that a large amount of the wall material is necessary. Therefore, the average particle diameter is preferably 0.1 $\mu$m or more.

When the light- and heat-sensitive transfer material of the present invention is used as a multicolor light- and heat-sensitive transfer material, the light- and heat-sensitive transfer layers of the light- and heat-sensitive transfer material are structured in such a manner that a plurality of monochrome light- and heat-sensitive transfer layers are superposed on a support. The respective light- and heat-sensitive transfer layers include the microcapsules which contain the electron donating colorless dye which form to different hues, and the photo-polymerizable compositions which contain the spectral sensitization dye having different maximum absorption wavelengths. When light is irradiated, the light- and heat-sensitive transfer layers are sensitized due to the differences in the wavelengths of the light sources to form a multicolor image.

An intermediate layer may be provided between the respective monochrome light- and heat-sensitive transfer layers which form the aforementioned light- and heat-sensitive transfer layer. The intermediate layer comprises mainly a binder. Additives such as hardener, polymer latex and the like may be contained therein, if desired.

In the light- and heat-sensitive transfer material of the present invention, as the binder for each of the layers including the protective layer, the light- and heat-sensitive transfer layer, the intermediate layer and the like, in addition to the same binders as those used for emulsifying and dispersing the photo-polymerizable composition and the water soluble polymer used for encapsulating the color forming component, solvent soluble high polymers such as polystyrene, polyvinylformal, polyvinylbutyral, acrylic resins, for example, polymethyl acrylate, polybutyl acrylate, polymethyl methacrylate, polybutyl methacrylate and copolymers of these, phenol resins, styrene/butadiene resins, ethyl cellulose, epoxy resins, urethane resins, and the like, and high polymer latexes of these can be used.

Among these binders, gelatin and polyvinyl alcohol are preferable.

Various surfactants may be used for each layer of the light- and heat-sensitive transfer material of the present invention for the purpose of improvement in applying, antistatic, improvement in slipping, emulsifying-and-dispersing, prevention of adhesion, and the like.

Examples of the surfactants include non-ionic surfactants such as saponin, and polyethylene oxide derivatives such as polyethylene oxide, alkyl ether of polyethylene oxide, and the like; anionic surfactants such as alkyl sulfonate, alkylbenzene sulfonate, alkylnaphthalene sulfonate, alkylsulfuric acid ester, N-acyl-N-alkyltaurines, sulfosuccinate ester, sulfoalkylpolyoxyethylenealkyl phenyl ether, and the like; amphoteric surfactants such as alkylbetaines, alkylsulfobetaines and the like; and cationic surfactants such as aliphatic groups, aromatic quaternary ammonium salts and the like.

In addition to the aforementioned additives, other additives may be added to the light- and heat-sensitive transfer layer, if desired.

Examples of the additives include dyes, UV ray absorbers, plasticizers, fluorescent whitening agents, matting agents, application aids, curing agents, antistatic agents, slip improving agents, and the like.

Typical examples of these additives are described in Research Disclosure Vol. 176, December, 1978, Item 17643 and Research Disclosure Vol. 187, November, 1979, Item 18716.

In the light- and heat-sensitive transfer material of the present invention, it is preferable to use a curing agent in the respective layers other than the heat-bonding layer, such as the light- and heat-sensitive transfer layer, the intermediate layer, the protective layer and the like.

In particular, it is preferable to use the curing agent in the protective layer to decrease the viscosity of the protective layer. Examples of curing agents include "gelatin curing agents" used for manufacturing photographic photosensitive materials such as formaldehyde-based compounds such as formaldehyde, glutaraldehyde and the like, the reactive halogen compound disclosed in U.S. Pat. No. 3,635,718, the compounds having a reactive ethylene unsaturated group disclosed in U.S. Pat. No. 3,635,718, the azirizine-based compound disclosed in U.S. Pat. No. 3,017,280, the epoxy-based compound disclosed in U.S. Pat. No. 3,091,537, halogenocarboxyaldehydes such as mucholoric acid, dioxanes such as dihydrodioxane, dichlorodioxane and the like, and the vinylsulfones disclosed in U.S. Pat. Nos. 3,642,486 and 3,687,707, the vinylsulfone precursors disclosed in U.S. Pat. No. 3,841,872 and the ketovinyls disclosed in U.S. Pat. No. 3,640,720. Examples of inorganic curing agent are chrome alum, zirconium sulfate, boric acid and the like.

Among these curing agents, 1,3,5-triacryloyl-hexahydro-s-triazine,
1,2-bisvinylsulfonylmethane,
1,3-bis(vinylsulfonylmethyl)propanol-2,
bis($\alpha$-vinylsulfonylacetoamide)ethane,
2,4-dichloro-6-hydroxy-s-triazine/sodium salt,
2,4,6-triethyleneimino-s-triazine, boric acid and the like are preferable.

The added amount of the curing agent is preferably 0.5 to 5% by weight with respect to the amount of the binder.

The light- and heat-sensitive transfer material used for the present invention can be formed such that after preparing the coating liquid for the light- and heat-sensitive transfer layer, the heat-bonding layer coating liquid and the like by using means for dissolving the respective components in the solvents, if necessary, they are coated on a desired support and dried.

Examples of the solvents used for preparing the coating liquid include water; alcohols such as methanol, ethanol, n-propanol, isopropanol, n-butanol, sec-butanol, methyl cellosolve, and 1-methoxy-2-propanol; halogen type solvents such as methylene chloride and ethylene chloride; ketones such as acetone, cyclohexanone, and methyl ethyl ketone; esters such as methyl acetate cellosolve, ethyl acetate, and methyl acetate; toluene; xylene, and the like. These solvents may be used either singly or in combinations of two or more. Among these, water is particularly preferable.

The coating liquid for the light- and heat-sensitive transfer layer is applied to a support by using a blade coater, a rod coater, a knife coater, a roll doctor coater, a reverse roll coater, a transfer roll coater, a gravure coater, a kiss roll coater, a curtain coater, an extrusion coater, or the like.

The method for application may be selected with reference to Research Disclosure, Vol. 200, December, 1980, Item 20036, Term XV.

The thickness of the light- and heat-sensitive transfer layer is preferably 0.1 to 50 $\mu$m and more preferably 5 to 35 $\mu$m.

The image recording method of the present invention obtained as described above can be used in various applications.

For example, the image recording method may be applied in a color printer, a label, a color proof, an OHP, a mask film, a display, a card, a ticket, a visiting card, a decorative material or the like.

Examples of the support used for the light- and heat-sensitive transfer material of the present invention include synthetic paper such as paper, coated paper, laminated paper and the like; films such as polyethylene terephthalate film, polyethylene naphthalate film, cellulose triacetate film, polyethylene film, polypropylene film, polystyrene film, polycarbonate film and the like; plates of metals such as aluminum, zinc, copper and the like; complexes of these; or supports on whose surfaces various processings have been carried out such as surface processing, undercoating, metal deposition or the like. The supports disclosed in Research Disclosure, Vol. 200, December, 1980, Item 20036, Term XVII may be used. Further, a polyurethane sheet, a rubber sheet and the like, which have elasticity themselves, may also be used.

Further, if desired, a cushion layer and an anti-halation layer may be provided on the surface of the support. A sliding layer, an anti-static layer, a curl preventing layer, or the like may be provided on the rear surface of the support.

In the light- and heat-sensitive transfer material according to the present invention, the light- and heat-sensitive transfer layer is set in close contact with the image receiving material via the heat-bonding layer and this laminated structure is heated so that transfer is carried out. Accordingly, in order to enhance the close contact between the light- and heat-sensitive transfer layer and the image receiving material, the support preferably has elasticity. Examples of such support include a sheet formed by a material itself having elasticity. Further, an elastic layer formed by a material having elasticity may be provided on one of the above-listed exemplary ordinary supports (at the side at which the light- and heat-sensitive transfer layer is formed).

Examples of materials having elasticity used for the support include resins having a small internal modulus of elasticity such as natural rubber, acrylate rubber, butyl rubber, butadiene rubber, isoprene rubber, styrene-butadiene rubber, chloroprene rubber, urethane rubber, silicone rubber, acrylic rubber, fluoro rubber, neoprene rubber, elastomers such as chlorosulfonated polyethylene, epichlorohydrin, EPDM, urethane elastomer and the like, polyethylene, polypropylene, polybutadiene, polybutene, polyurethane, ABS resin, acetate, cellulose acetate, amide resin, polystyrene, epoxy resin, phenolformaldehyde resin, polyester, acrylic resin, ethylene-vinyl acetate copolymer, acrylonitrile-butadiene copolymer, vinyl chloride-vinyl acetate copolymer, vinyl acetate resin, flexible vinyl chloride resin, polyvinyliden chloride, polytetrafluoroethylene and the like. The elastic layer or the elastic support is formed with one or more of these materials as the main component thereof.

Next, a description will be given of the image receiving material used in the image recording method of the present invention.

The image receiving material is a material which becomes a support of the light- and heat-sensitive transfer layer after transfer. In addition to materials which can be used as a support of the light- and heat-sensitive transfer material such as an ordinary paper support (printing paper such as ordinary paper, coated paper, and the like, corrugated board and the like), cloth, leather, plastic, rubber, wood, glass, porcelain and the like may be used.

Treatments for enhancing the close contact with the heat-bonding layer can be carried out on the surfaces of such supports. Examples of such treatments include precoating, prelaminating, anchor coating, etching treatment, sanding treatment, chemical treatment, solvent treatment, corona discharge treatment, plasma treatment and the like.

By utilizing a structure in which the heat-bonding layer is provided on the support in advance, it is possible to obviate the need to form a heat-bonding layer which is the outermost layer of the light- and heat-sensitive transfer material used in the present invention.

In the light- and heat-sensitive transfer material relating to the present invention, heat development processing is carried out such that, after exposure for forming a latent image, the heat-bonding layer is closely contacted with the image receiving material. As a result, an image is formed, and at the same time, the close contact of the image receiving material with the heat-bonding layer can be accomplished as a pre-step of transfer.

For the heating and close contact at the time of heating processing, conventionally known means such as heat rollers, hot plates, heat blocks or the like may be employed. A means such as heated embossing rollers or the like is preferable. Generally, the heating temperature is preferably 80° C. to 200° C., and more preferably 85° C. to 150° C. The heating time is preferably 1 second to 5 minutes and more preferably 3 seconds to 1 minute.

Transfer is completed by removing the support after the heat development processing so that the light- and heat-sensitive transfer layer on which an image has been formed is transferred onto the image receiving material. The UV absorption layer or the protective layer formed adjacent to the support is thus the outermost layer of the light- and heat-sensitive transfer layer due to the transfer. These layers are the lowermost layer at the time of image formation, and therefore, they do not inhibit irradiation of light at the time of forming the latent image. After transfer, they are positioned as the uppermost layer and can protect the formed image effectively.

By irradiating the surface of the transferred light- and heat-sensitive transfer layer with light, the formed image is fixed, and the components which decrease the pure whiteness of the background portion such as the spectral sensitization compound and the diazonium salt compound and the like which remain in the recording layer are decolorized, decomposed, or deactivated.

As a result, the components which color the background portion and remain in the recording layer such as in the background portion (i.e., the non-image portion) can be removed, and the remaining diazonium salt compound is also deactivated to suppress the color forming reaction. Accordingly, density variation of the image can be suppressed and the image storability can be enhanced to a large extent.

When image formation is carried out by using the light- and heat-sensitive transfer material of the present invention in the aforementioned method, the sensitivity can be further enhanced by providing a step in which, during image formation, the entire surface of the light- and heat-sensitive transfer material is uniformly preheated at a predetermined temperature which is less than the color forming temperature.

The light- and heat-sensitive transfer material of the present invention can be used not only with the above-described image recording method but also with other known recording methods.

For example, the light- and heat-sensitive transfer material of the present invention can be applied to a recording method in which, in order to realize thermal recording using a heating apparatus such as a thermal head or the like, and in order to improve contrast and image quality, when irradiating laser beams which are used for the silver halide light- and heat-sensitive transfer material which is proposed by 3M Co. in International Application WO95/31754, the laser beams are irradiated such that their beam spots overlap at a predetermined range so that the image is formed.

Also, the recording method proposed by Canon Inc. in JP-A No. 60-195568 may be utilized. In this recording method, laser beams are irradiated onto the surface of a recording material at an inclined incident angle so that the reflection pitch at which the incident beams reflect on an interface of the photosensitive layer of the recording material is made larger than a beam spot diameter. Further, a technology which prevents optical interference generated at the recording material is utilized so that an image with higher quality can be obtained.

EXAMPLES

The present invention will be explained by way of examples, but the present invention is not limited to these examples. In these examples, "part" and "%" indicate "part by weight" and "percent by weight", respectively.

<Preparation of Electron Donating Colorless Dye Encapsulating Microcapsule Solution>

(1-a) Preparation of Electron Donating Colorless Dye Encapsulating Microcapsule Solution (I)

8.9 g of an electron donating colorless dye (1) which forms the color yellow was dissolved in 16.9 g of ethyl acetate, to which were added 20 g of a capsule wall material (Takenate D-110N manufactured by Takeda Chemical Industries Ltd.) and 2 g of a capsule wall material (Milionate MR200 manufactured by Nippon Polyurethane Industries Ltd.).

The resultant solution was added to a mixed solution of 42 g of 8% gelatin phthalate and 1.4 g of 10% sodium dodecylbenzene sulfonate solution, followed by emulsifying and dispersing at 20° C. to prepare an emulsion. Then, 14 g of water and 72 g of 2.9% tetraethylenepentamine aqueous solution were added to the emulsion. The mixture was heated to 60° C. while being stirred for 2 hours to prepare a microcapsule solution (I) with an average particle diameter of 0.5 µm, which contained the electron donating colorless dye (1) as the core.

(1-b) Preparation of Electron Donating Colorless Dye Encapsulating Microcapsule Solution (II)

Microcapsule solution (II) was prepared by the same manner as that of (1-a) except that instead of the electron donating colorless dye (1) used in (1-a), an electron donating colorless dye (2) which form the color magenta was used. The prepared microcapsule solution (II) had an average particle diameter of 0.5 µm and contained the electron donating colorless dye (2) as the core.

(1-c) Preparation of Electron Donating Colorless Dye Encapsulating Microcapsule Solution (III)

Microcapsule solution (III) was prepared by the same manner as that of (1-a) except that instead of the electron donating colorless dye (1) used in (1-a), an electron donating colorless dye (3) which form the color cyan was used. The prepared microcapsule solution (III) had an average particle diameter of 0.5 µm and contained the electron donating colorless dye (3) as the core.

(1-d) Preparation of Electron Donating Colorless Dye Encapsulating Microcapsule Solution (IV)

Microcapsule solution (IV) was prepared by the same manner as that of (1-a) except that instead of the electron donating colorless dye (1) used in (1-a), an electron donating colorless dye (4) which form the color black was used. The prepared microcapsule solution (IV) had an average particle diameter of 0.5 µm and contained the electron donating colorless dye (4) as the core.

Electron Donating Colorless Dye (1)

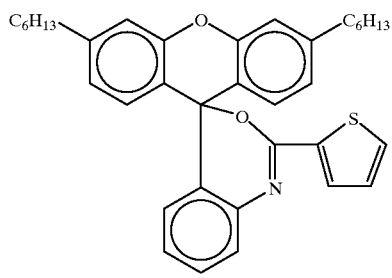

Electron Donating Colorless Dye (2)

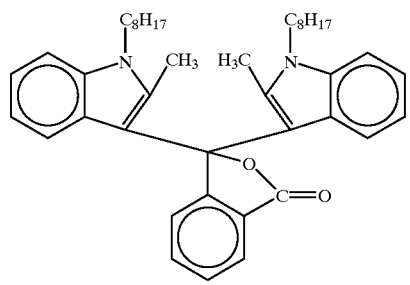

Electron Donating Colorless Dye (3)

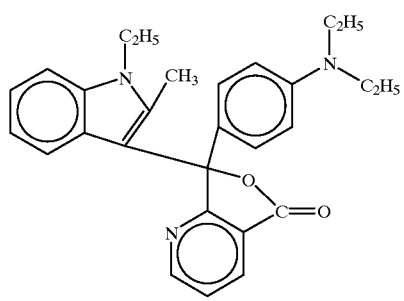

Electron Donating Colorless Dye (4)

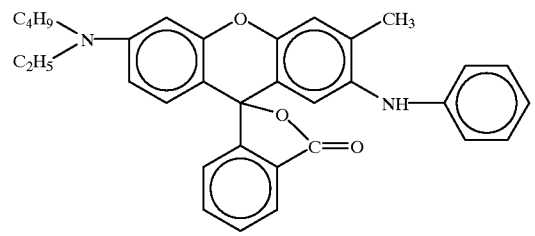

<Preparation of Photo-Polymerizable Composition Emulsion>

(2-a) Preparation of Photo-Polymerizable Composition Emulsion (1)

5 g of an electron accepting compound (1) having a polymerizable group (represented below) was added to a mixed solution of 0.6 g of the organic borate compound (29), 0.1 g of the spectral sensitization dye-based borate compound (26), 0.1 g of an aid (1) for sensitivity enhancement and 3 g of isopropyl acetate (which has a solubility in water of about 4.3%).

The resultant solution was added to a mixed solution of 13 g of 13% gelatin aqueous solution, 0.8 g of 2% surfactant (1) aqueous solution, and 0.8 g of 2% surfactant (2) aqueous solution, and the resultant mixed solution was emulsified by using a homogenizer (manufactured by Nippon Seiki Co, Ltd.) at 10,000 rpm for 5 minutes to prepare a photo-polymerizable composition emulsion (1).

Polymerizable Electron Accepting Compound (1)

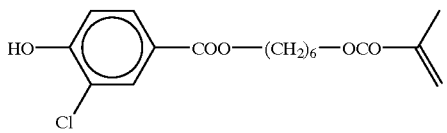

Aid (1)

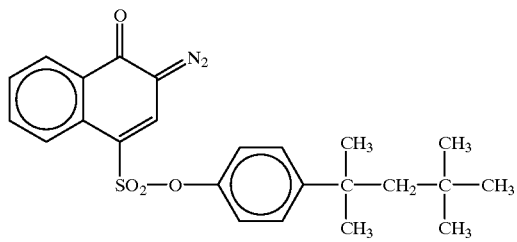

Spectral Sensitization Dye-based Borate Compound (26)

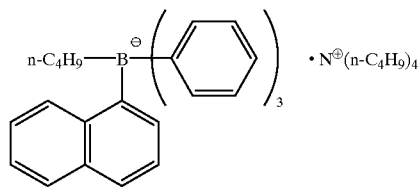

Spectral Sensitization Dye-based Borate Compound (28)

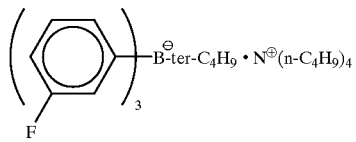

Organic Borate Compound (29)

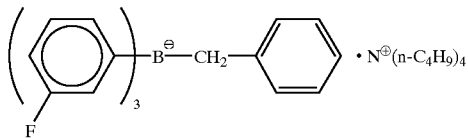

Spectral Sensitization Dye-based Borate Compound (30)

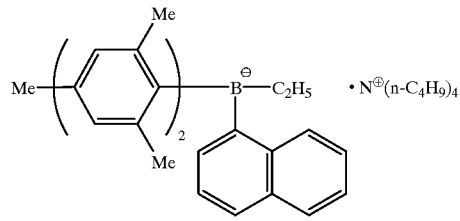

Surfactant (1)

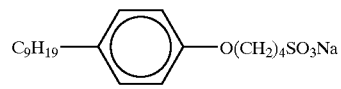

Surfactant (2)

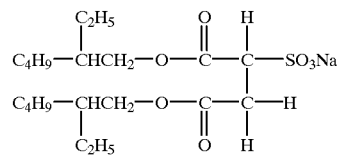

Surfactant (3)

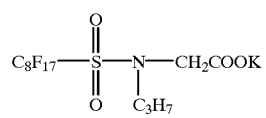

Surfactant (4)

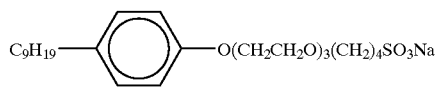

(2-b) Preparation of Photo-Polymerizable Composition Emulsion (2)

A photo-polymerizable composition emulsion (2) was prepared in the same manner as that of (2-a) except that 0.1 g of the aforementioned spectral sensitization dye-based borate compound (28) was used instead of the spectral sensitization dye-based borate compound (26) used in (2-a).

(2-c) Preparation of Photo-Polymerizable Composition Emulsion (3)

A photo-polymerizable composition emulsion (3) was prepared in the same manner as that of (2-a) except that 0.1 g of the aforementioned spectral sensitization dye-based borate compound (30) was used instead of the spectral sensitization dye-based borate compound (26) used in (2-a).

<Preparation of Coating Solution for Light- and Heat-Sensitive Transfer Layer>

(3-a) Preparation of Coating Solution (1) for Light- and Heat-Sensitive Transfer Layer—(Black)

4 g of the electron donating colorless dye encapsulating microcapsules (IV), 12 g of the photo-polymerizable composition emulsion (2), and 12 g of 15% gelatin aqueous solution were mixed to prepare a coating solution (1) for the light- and heat-sensitive transfer layer.

(3-b) Preparation of Coating Solution (2) for Light- and Heat-Sensitive Transfer Layer—(Yellow)

4 g of the electron donating colorless dye encapsulating microcapsules (I), 12 g of the photo-polymerizable composition emulsion (1), and 12 g of 15% gelatin aqueous solution were mixed to prepare a coating solution (2) for the light- and heat-sensitive transfer layer.

(3-c) Preparation of Coating Solution (3) for Light- and Heat-Sensitive Transfer Layer—(Magenta)

4 g of the electron donating colorless dye encapsulating microcapsules (II), 12 g of the photo-polymerizable composition emulsion (2), and 12 g of 15% gelatin aqueous solution were mixed to prepare a coating solution (3) for the light- and heat-sensitive transfer layer.

(3-d) Preparation of Coating Solution (4) for Light- and Heat-Sensitive Transfer Layer—(Cyan)

4 g of the electron donating colorless dye encapsulating microcapsules (III), 12 g of the photo-polymerizable composition emulsion (3), and 12 g of 15% gelatin water solution were mixed to prepare a coating solution (4) for the light- and heat-sensitive transfer layer.

<Preparation of Intermediate Layer Coating Solution>

An intermediate layer coating solution (1) was prepared by mixing 4.5 g of 15% gelatin aqueous solution, 4.5 g of distilled water, and 0.3 g of 2% surfactant (4) aqueous solution.

<Preparation of Protective Layer Coating Solution>

A protective layer coating solution (1) was prepared by mixing 4.5 g of 10% gelatin aqueous solution, 4.5 g of distilled water, 0.5 g of 2% surfactant (3) aqueous solution, 0.3 g of 2% surfactant (4) aqueous solution, 0.5 g of 2% vinylsulfone-based compound (curing agent) aqueous solution, Sailoid 72 (manufactured by Fuji-Devison Chemical, Ltd.) such that an amount of Sailoid 72 in a dried state of the final coating was 50 mg/m$^2$, and 1 g of Snowtex N.

<Preparation of Heat-bonding Layer Coating Solution>

4.5 g of an ethylene-vinyl acetate resin emulsion (Resem EV-2 manufactured by Chukyo Yushi Co., Ltd.), 4.5 g of a butyral resin emulsion (J-667 manufactured by Chukyo Yushi Co., Ltd.) and 0.1 g of a surfactant (Megafac F-177 manufactured by Dainippon Ink and Chemicals, Inc.) were mixed with 10 g of water to prepare a heat-bonding layer coating solution.

Example 1 (Black Color Forming)

On a polyethylene terephthalate (PET) blue base support having a thickness of 175 μm, the protective layer coating solution (1) was applied such that the dry weight of the coating layer was 2 g/m$^2$, and was dried. On the coating layer, the coating solution (1) for the light- and heat-sensitive transfer layer was applied by a coating bar such that the dry weight of the entire coating layer was 30 g/m$^2$, and the coating solution was dried.

On the coating layer, the heat-bonding layer coating solution was applied by a coating bar such that the dry weight of the entire coating layer was 2.0 g/m$^2$, and the coating solution was dried to prepare the light- and heat-sensitive transfer material (1).

The light- and heat-sensitive transfer material (1) was exposed from the heat-bonding layer side thereof with semiconductor laser light of a wavelength of 657 nm in a manner such that the maximum irradiating energy of the laser was 15 mJ/cm$^2$ and the irradiating energy was successively changed stepwise, to obtain a step wedge-shaped image.

As the image receiving material, a coated paper having a basis weight of 130 g (manufactured by Mitsubishi Paper Mills Limited) was used. The heat-bonding layer side of the transfer material on which the latent image was formed by the exposure was closely contacted with the surface of coated paper and they were heated by heated embossing rollers at 120° C. for 5 seconds. Thereafter, the support was removed from the paper, and the entire surface of the transfer layer of the recording material was irradiated with light from the protective layer side of the transfer layer on a high luminance schaukasten of 58,000 lux for 30 seconds. A step wedge-shaped image in which colors were formed sharply and which had high pure whiteness at the background portion thereof was able to be obtained.

<Evaluation of Sensitivity>

The sensitivity of the light- and heat-sensitive transfer material was determined as follows. In one step, the difference between the irradiating energy in the step and the energy necessary for forming the background portion of the light- and heat-sensitive transfer material (i.e., (the energy to form the background portion)–(the irradiating energy in the step)), which difference corresponds to the same exposure amount in the wedge images of the light- and heat-sensitive transfer materials, was calculated and used as the index of sensitivity.

Accordingly, the smaller the value, the higher the sensitivity. Results of measurement are shown in Table 1.

<Thermo Processing>

The resultant light- and heat-sensitive transfer material (1) was allowed to stand for 1 day in an environment in which the temperature was 50° C. and the relative humidity was 30% RH.

<Measurement of Density>

The color forming density (Dmax), fogging of the background portion (Dmin), and fogging of the background portion after the thermo processing (Dmin-S) were measured by using a Macbeth reflection type densitometer (manufactured by Macbeth Inc.).

The results of measurement are shown in Table 1 together with the aforementioned results.

Example 2 (Multicolor Color Forming)

On a support having a thickness of 100 μm formed by a polyester film laminated with a white-pigment-containing layer (Lumirror E-68L manufactured by Toray Industries, Inc.), the protective layer coating solution (1) was applied by a coating bar and dried such that the dry weight thereof was 1.5 g/m$^2$. On this layer, the coating solution (4) for the light- and heat-sensitive transfer layer (which forms the color cyan) was applied and dried such that the dry weight thereof was 4 g/m$^2$. On this layer, the intermediate layer coating solution (1) was applied and dried such that the dry weight thereof was 1.5 g/m$^2$.

Further, on the intermediate layer, the coating solution (3) for the light- and heat-sensitive transfer layer (which forms the color magenta) was applied by using a coating bar and dried such that the dry weight of the coating layer was 4 g/m$^2$. On this layer, the intermediate layer coating solution was applied and dried such that the dry weight thereof was 1.5 g/m$^2$.

Moreover, on this intermediate layer, the coating solution (2) for the light- and heat-sensitive transfer layer (which forms the color yellow) was applied by a coating bar and dried such that the dry weight of the coating layer was 4 g/m$^2$. On this layer, the heat-bonding layer coating solution was applied and dried such that the dry weight thereof was 2.0 g/m$^2$, to prepare the light- and heat-sensitive transfer material (2).

The resultant light- and heat-sensitive transfer material (2) was exposed imagewise from the heat-bonding layer side thereof by semiconductor laser light having a wavelength of 780 nm, and then by semiconductor laser light having a wavelength of 650 nm, and then by solid state laser light having a wavelength of 532 nm.

The heat-bonding layer side of the recording material on which the latent image was formed by the exposure was closely contacted with the surface of the coated paper, and they were heated by heated embossing rollers at 120° C. for 5 seconds, and thereafter, the support was removed from the coated paper. The surface of the recording layer was irradiated with light from the protective layer side of the transfer layer on a high luminance schaukasten of 58,000 lux for 30 seconds. An image in which colors were formed sharply and which had high pure whiteness at the background portions was able to be obtained.

The fog densities of the light- and heat-sensitive transfer material (2) before and after thermo processing were measured in the same way as in Example 1, and the results are shown in Table 1.

Comparative Examples 1 and 2

Step wedge-shaped images were formed by using the light- and heat-sensitive transfer materials (1) and (2) obtained by Examples 1 and 2 and in the same manner as in Example 1 except that the surfaces of the recording layers of the light- and heat-sensitive transfer materials were not irradiated by light on a high luminance schaukasten of 58,000 lux for 30 seconds.

In Comparative Example 1, the sensitivity and the color forming density were measured in the same manner as those of Example 1, and in Comparative Examples 1 and 2, the fog densities before and after thermo processing were measured. Results are shown in Table 1.

Comparative Example 3

The light- and heat-sensitive transfer material (3) was obtained in the same way as in Example 1 except that the spectral sensitization dye-based borate compound (28) used in the photo-polymerizable composition emulsion (2) of Example 1 was not used. A step wedge-shaped image was formed in the same manner as that of Example 1 by using the light- and heat-sensitive transfer material (3).

The color forming density and the fog density of the light- and heat-sensitive transfer material (3) were measured in the same manners as in Example 1, and the results are shown in the following Table 1.

TABLE 1

| | Sensitivity (mJ/cm$^2$) | Dmax | Dmin | Dmin-S After Thermo Processing |
|---|---|---|---|---|
| Example 1 | 6.0 | 2.4 | 0.09 | 0.10 |
| Example 2 | — | — | 0.04 | 0.05 |
| Comparative Example 1 | 6.1 | 2.5 | 0.35 | 0.8 |
| Comparative Example 2 | — | — | 0.8 | 1.2 |
| Comparative Example 3 | — | 2.4 | 2.4 | — |

As can be clearly seen from Table 1, images were formed by using the light- and heat-sensitive transfer materials (1) and (2) of the present invention in the image recording method of the present invention in which the light- and heat-sensitive transfer materials (1) and (2) were exposed imagewise, heated, and thereafter the supports were removed, and the fixing step for irradiating the surfaces of the recording layers with light was carried out. The resultant images had high sensitivity. Further, images could be effectively formed on image receiving sheets at the same time as development. Further, there was hardly any increase in the densities of the background portions due to thermo processing. In the resultant images, the coloring of the spectral sensitization compound was thoroughly decolorized by irradiating the surfaces of the recording layers with light and the formed images were fixed. Further, images which had excellent pure whiteness at the background portions thereof, high contrast and excellent storage stability were able to be formed effectively on the image receiving sheets.

On the other hand, in Comparative Examples 1 and 2, images were formed by using the light- and heat-sensitive transfer materials (1) and (2) of the present invention, but were not subjected to the fixing step for irradiating the surfaces of the recording layers with light after exposure and heating. Images could be formed on the image receiving sheets, but the densities of the background portions were increased extremely due to the thermo processing, and images with high contrast and high sharpness were not able to be formed. In the case of the light- and heat-sensitive transfer material (3) of Comparative Example 3 in which the photoinitiator prescribed in the present invention was not used, sufficient sensitivity was not able to be obtained and an image was not able to be formed.

<Preparation of Diazonium Salt Compound Encapsulating Microcapsule Solution>

(4-a) Preparation of Diazonium Salt Compound Encapsulating Microcapsule Solution (V)

4.6 parts of a diazonium salt compound (the following compound A) and 10.4 parts of diphenyl phthalate ester were added to 13.7 parts of ethyl acetate, and these compounds were uniformly mixed.

Next, into the mixed solution, 5.5 parts of a capsule wall material (Takenate D110N manufactured by Takeda Chemical Industries Ltd.) and 2.8 parts of a capsule wall material (Milionate MR200 manufactured by Nippon Polyurethane Industries Ltd.) were added.

The resultant solution was added to a mixed solution of 62.7 parts of 8% gelatin phthalate aqueous solution, 17.4 parts of water and 0.4 parts of sucraph AG-S (manufactured by Nippon Fine Chemical Co., Ltd.), and the resultant solution was emulsified and dispersed by a homogenizer at 40° C. and 8,000 rpm for 10 minutes. To the resultant emulsion, 50 parts of water and 0.26 parts of diethylenetriamine were added. After the mixture was homogenized, an encapsulation reaction was caused at 60° C. for 3 hours while stirring, to prepare a diazonium salt compound encapsulating microcapsule solution (V). The average particle diameter of the microcapsules was 0.3 to 0.4 μm.

(4-b) Preparation of Diazonium Salt Compound Encapsulating Microcapsule Solution (VI)

In 19.0 parts of ethyl acetate, 2.8 parts of butyl sulfate and, instead of the compound A used in (4-1), 2.8 parts of a diazonium salt compound (compound B) having a maximum absorption wavelength of photodecomposition of 365 nm were dissolved.

To the solution, 5.9 parts of isopropyl phenyl which was a high-boiling-point solvent and 2.5 parts of tricresyl phophate were added, and the resultant solution was heated and uniformly mixed. Further, 7.6 parts of a capsule wall material (Takenate D110N manufactured by Takeda Chemical Industries Ltd.) was added to the resultant solution to prepare a uniformly stirred solution.

64 parts of 6% by weight gelatin (M part P-9066 manufactured by Nippi Gelatin Industries, Ltd.) aqueous solution to which 2.0 parts of 10% sodium dodecyl sulfonate aqueous solution was added was prepared. To the solution, the diazonium salt solution was added, and the resultant mixed solution was emulsified and dispersed by a homogenizer.

20 parts of water was added to the resultant emulsion and the mixture was homogenized. Thereafter, the mixture was heated to 40° C. while stirring, and then an encapsulation reaction was caused for 3 hours. Then, the temperature of the mixture was lowered to 35° C. and 6.5 parts of an ion exchange resin (Amberlite IRA68 manufactured by Organo Co., Ltd.) and 13 parts of an ion exchange resin (Amberlite IRC50 manufactured by Organo Co., Ltd.) were added to the mixture, and the resultant mixture was further stirred for one hour.

Thereafter, the ion exchange resins were filtered to prepare a diazonium salt compound encapsulating microcapsule solution (VI). The average particle diameter of the microcapsules was 0.64 μm.

(4-c) Preparation of Diazonium Salt Compound Encapsulating Microcapsule Solution (VII)

2.8 parts of a diazonium salt compound (the following compound C) and 10 parts of tricresylphosphate were added to 19.0 parts of ethyl acetate and the mixture was uniformly mixed. Then, 7.6 parts of a capsule wall material (Takenate D110N manufactured by Takeda Chemical Industries Ltd.) was added to the mixed solution. The resultant solution was added to a mixed solution of 46 parts of 8% gelatin phthalate aqueous solution, 17.5 parts of water and 2 parts of 10% sodium dodecylbenzenesulfonate aqueous solution, and the resultant solution was emulsified and dispersed by a homogenizer at 40° C. and 10,000 rpm for 10 minutes.

To the resultant emulsion, 20 parts of water was added, and the mixture was homogenized. Thereafter, an encapsulation reaction was caused at 40° C. for 3 hours while stirring to prepare a diazonium salt compound encapsulating microcapsule solution (VII). The average particle diameter of the microcapsules was 0.7 to 0.8 μm.

(Compound A)

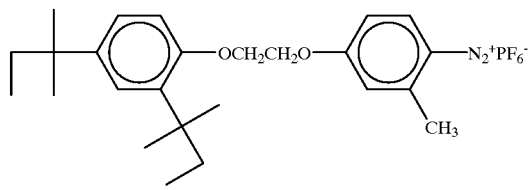

(Compound B)

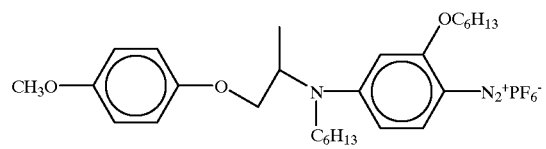

(Compound C)

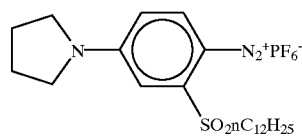

<Preparation of Photo-Polymerizable Composition Emulsion>

(5-a) Preparation of Photo-Polymerizable Composition Emulsion (4)

A compound which had the following composition was dissolved in 10.5 parts of ethyl acetate, and to the resultant solution, 0.48 parts of tricresyl phophate which is a high-boiling-point solvent, 0.24 parts of diethyl maleate, and 1.27 parts of Bionin A41C (manufactured by Takemoto Oil & Fat Co., Ltd.) were added, and the mixture was heated to prepare a uniform mixed solution.

| | |
|---|---|
| Organic borate compound (29) | 0.6 parts |
| Spectral sensitization dye-based borate compound (26) | 0.1 parts |
| Aid for sensitivity enhancement (compound J) | 0.1 parts |
| Coupler compound (compound D) | 3.0 parts |
| Triphenyl guanidine | 4.0 parts |
| 1,1-(p-Hydroxyphenyl)-2-ethylhexane | 4.0 parts |
| 4,4'-(p-Phenylenediisopropylidene) diphenol | 8.0 parts |
| 2-Ethylhexyl-4-hydroxybenzoate | 8.0 parts |
| Antioxidant (above compound E) | 2.0 parts |
| 1,1,3-Tris (2-methyl-4-hydroxy-5-t-butylphenyl) butane | 2.0 parts |

The resultant mixed solution was added to 93 parts of 8% gelatin (#750 gelatin manufactured by Nitta Gelatin Inc.) aqueous solution, and the resultant solution was emulsified and dispersed by a homogenizer at 10,000 rpm for 5 minutes. The remaining ethyl acetate was evaporated from the resultant emulsion to prepare a photo-polymerizable composition emulsion (4) of the coupler compound.

(5-b) Preparation of Photo-Polymerizable Composition Emulsion (5)

A compound which had the following composition was dissolved in 10.5 parts of ethyl acetate, and to the resultant solution, 0.48 parts of tricresyl phophate which is a high-boiling-point solvent, 0.24 parts of diethyl maleate, and 1.27 parts of Bionin A41C (manufactured by Takemoto Oil & Fat Co., Ltd.) were added, and the mixture was heated to prepare a uniform mixed solution.

| | |
|---|---|
| Organic borate compound (29) | 0.6 parts |
| Spectral sensitization dye-based borate compound (27) | 0.1 parts |
| Aid for sensitivity enhancement (compound J) | 0.1 parts |
| Coupler compound (compound F) | 3.0 parts |
| Triphenyl guanidine | 3.6 parts |
| 4,4'-(p-Phenylenediisopropylidene)diphenol | 6.6 parts |

The mixed solution was added to 93 parts of 8% gelatin (#750 gelatin manufactured by Nitta Gelatin Inc.) aqueous solution, and the resultant solution was emulsified and dispersed by a homogenizer at 10,000 rpm for 5 minutes. The remaining ethyl acetate was evaporated from the emulsion to prepare a photo-polymerizable composition emulsion (5) of the coupler compound. (5-c) Preparation of Photo-Polymerizable Composition Emulsion (6)

A compound which had the following composition was dissolved in 10.5 parts of ethyl acetate to prepare a uniform mixed solution.

| | |
|---|---|
| Organic borate compound (29) | 0.6 parts |
| Spectral sensitization dye-based borate compound (28) | 0.1 parts |
| Aid for sensitivity enhancement (compound J) | 0.1 parts |
| Coupler compound (following compound G) | 3.0 parts |
| Triphenyl guanidine | 3.0 parts |
| Tricresyl phosphate | 0.5 parts |
| Diethyl maleate | 0.24 parts |

(Compound D)

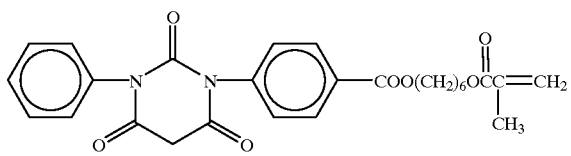

(Compound E)

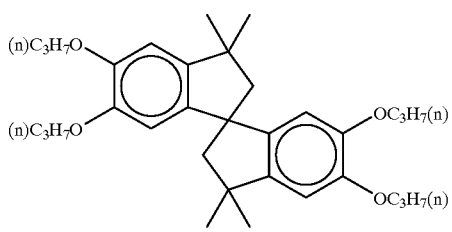

(Compound G)

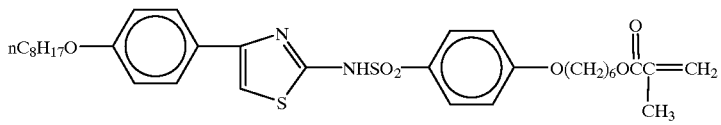

(Compound F)

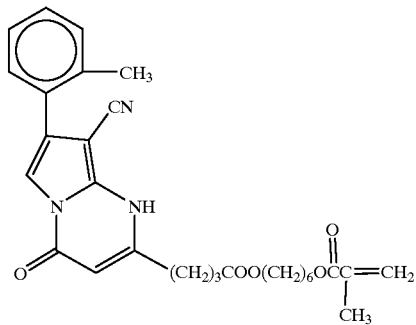

(Compound J)

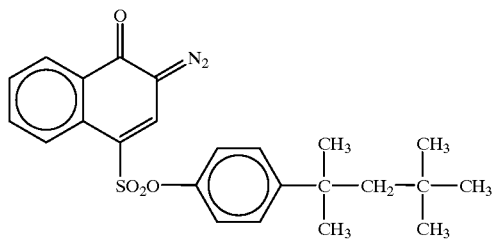

The resultant mixed solution was added to a mixed solution in which 49 parts of 15% lime-treated gelatin aqueous solution, 9.5 parts of 10% sodium dodecylbenzenesulfonate aqueous solution and 35 parts of water were uniformly mixed at 40° C., and then, the resultant mixed solution was dispersed by a homogenizer at 40° C. and 10,000 for 10 minutes. The remaining ethyl acetate was evaporated from this emulsion to prepare a photopolymerizable composition emulsion (6) of the coupler compound.

<Preparation of Coating Solutions for Light- and Heat-Sensitive Transfer Layers>

(6-a) Preparation of Coating Solution (5) for Light- and Heat-Sensitive Transfer Layer (Yellow)

10 parts of the diazonium salt compound encapsulating microcapsule solution (V) and 30 parts of the photopolymerizable composition emulsion (5) of the coupler compound were mixed to prepare a coating solution (5) for the light- and heat-sensitive transfer layer.

(6-b) Preparation of Coating Solution (6) for Light- and Heat-Sensitive Transfer Layer (Cyan)

The diazonium salt compound (compound B) encapsulating microcapsule solution (VI), the photo-polymerizable composition emulsion (5) of the coupler compound, and styrene-butadiene rubber (SBR: SN 307 manufactured by Sumitomo Nogatta Co., Ltd.) were mixed together such that the ratio of the diazonium salt compound (compound B) to the coupler was 1/2. Then, to this mixture, L-ascorbic acid (Vitamin C manufactured by Takeda Chemical Industries Ltd.) was added such that the ratio of the L-ascorbic acid to the diazonium salt compound (compound B) was 1/40, so as to prepare a coating solution (6) for the light- and heat-sensitive transfer layer.

(6-c) Preparation of Coating Solution (7) for Light- and Heat-Sensitive Transfer Layer (Magenta)

3.6 parts of the diazonium salt compound encapsulating microcapsule solution (VII), 3.3 parts of water, and 9.5 parts of the photo-polymerizable composition emulsion (6) of the coupler compound were mixed to prepare a coating solution (7) for the light- and heat-sensitive transfer layer.

<Preparation of Intermediate Layer Coating Solution (2)>

To 90 parts of 14% gelatin (#750 gelatin manufactured by Nitta Gelatin Inc.) aqueous solution were added 8.2 parts of 4% boric acid aqueous solution, 1.2 parts of 2% aqueous solution of sodium (4-nonylphenoxytrioxyethylene) butylsulfonate and 7.5 parts of 2% aqueous solution of a 3:1 (weight ratio) mixture of $(CH_2=CHSO_2CH_2CONHCH_2)$—$(CH_2NHCOCH_2SO_2CH=CH_2)$ and $CH_2$—$(CH_2NHCOCH_2SO_2CH=CH_2)_2$. This mixture was uniformly stirred to prepare an intermediate layer coating solution (2).

<Preparation of Intermediate Layer Coating Solution (3)>

To 57 parts of 13% gelatin aqueous solution were added 0.4 parts of 2% aqueous solution of sodium (4-nonylphenoxytrioxyethylene)butylsulfonate, 8.3 parts of 2% by weight aqueous solution of a 3:1 (weight ratio) mixture of $(CH_2=CHSO_2CH_2CONHCH_2)$—$(CH_2NHCOCH_2SO_2CH=CH_2)$ and $CH_2$—$(CH_2NHCOCH_2SO_2CH=CH_2)_2$, and 2.4 parts of PVP-k15 (GAF manufactured by Gokyo Sangyo Co., Ltd.). This mixture was uniformly stirred to prepare an intermediate layer coating solution (3).

<Preparation of Protective Layer Coating Solution (2)>

2.0 parts of 20.5% zinc stearate dispersion (Hydrine F115 manufactured by Chukyo Yushi Co, Ltd.) was added to 61 parts of 5.0% itaconic acid modified polyvinyl alcohol (KL-318 manufactured by Kuraray Co., Ltd.) aqueous solution. To this mixture, 8.4 parts of 2% $C_{12}H_{25}O(CH_2CH_2O)H$ aqueous solution, 8.0 parts of a fluorine-based parting agent (ME-313 manufactured by Daikin Co, Ltd.), and 0.5 parts of flour starch (KF-4 manufactured by Kagoshima Starch Co., Ltd.) were added, and this mixture was uniformly stirred. The resultant solution is referred to as the "mother liquor" hereinafter.

12.5 parts of 20% ion exchanged Kaogross (manufactured by Shiraishi Kogyo Co., Ltd.) aqueous solution, 0.06 parts of Pois 532A (manufactured by Kao Corp.), 1.87 parts of Hydrine Z-7 (manufactured by Chukyo Yushi Co., Ltd.), 1.25 parts of 10% polyvinyl alcohol (PVA 105 manufactured by Kuraray Co., Ltd.), and 0.39 parts of 2% sodium dodecyl sulfonate aqueous solution were mixed together, and this mixture was finely dispersed by a Dynomill. The resultant liquid is referred to as the "pigment liquid" hereinafter.

4.4 parts of the pigment liquid was added to 80 parts of the mother liquor, and this mixed solution was stirred for about 30 minutes. Thereafter, 2.8 parts of Wetmaster 500 (manufactured by Toho Chemical Industry Co., Ltd.) was added to the mixed solution, and the resultant solution was further stirred for about 30 minutes or more to prepare a protective layer coating solution (2).

Example 3 (Yellow Color Forming)

On a support for photographic printing paper formed by laminating polyethylene on wood-free paper, the protective layer coating solution (2), the coating solution (5) for the light- and heat-sensitive transfer layer, and the heat-bonding layer coating solution were applied by using a Mayer bar in that order from the support side, and the coatings were dried to prepare a light- and heat-sensitive transfer material (4). The dry coated amount of the light- and heat sensitive transfer layer was 3.5 g/m$^2$, and the dry coated amount of the protective layer was 1.23 g/m$^2$.

A step wedge-shaped image was formed by using the light- and heat-sensitive transfer material (4) and in the same manner as in Example 1. A step wedge-shaped image in which colors were formed sharply and which had high pure whiteness at the background portion thereof was able to be obtained.

The sensitivity, the color forming density, and fog densities before and after thermo processing, of the light- and heat-sensitive transfer material (4), were measured in the same manners as in Example 1. Results are shown in the following Table 2.

(Example 4) Multicolor Color Forming

On a support for photographic printing paper formed by laminating polyethylene on wood-free paper, the protective layer coating solution (2), the coating solution (5) for the light- and heat-sensitive transfer layer, the intermediate layer coating solution (2), the coating solution (6) for the light- and heat-sensitive transfer layer, the intermediate layer coating solution (3), the coating solution (7) for the light- and heat-sensitive transfer layer, and the heat-bonding layer coating solution were coated in that order from the support side. And then, the coatings were dried to prepare a light- and heat-sensitive transfer material (5) which had three multicolor light- and heat-sensitive transfer layers.

The light- and heat-sensitive transfer material (5) was exposed in the same manner as in Example 2 to form an image. An image in which colors were formed sharply and which had high pure whiteness at the background portion thereof was able to be obtained.

Fog densities before and after thermo processing, of the light- and heat-sensitive transfer material (5), were measured in the same manner as in Example 1. Results are shown in the following Table 2.

Comparative Examples 4 and 5

Step-wedge shaped images were obtained by using light- and heat-sensitive transfer materials (4) and (5) obtained in Examples 3 and 4 and in the same manner as in Example 3 except that the surfaces of the recording layers were not irradiated with light on a high luminance schaukasten of 58,000 lux for 30 seconds.

The sensitivity and the color forming density of the light- and heat-sensitive transfer material (4) were measured in the same manners as in Example 1, and fog densities of the light- and heat-sensitive transfer materials (4) and (5) before and after thermo processing were measured in the same manners as in Example 1. Results are shown in Table 2.

Comparative Example 6

The light- and heat-sensitive transfer material (6) was prepared in the same manner as in Example 3 except that the spectral sensitization dye-based borate compound (26) used in the photo-poymerizable composition emulsion (4) of Example 3 was not used.

A step wedge-shaped image was formed by using the light- and heat-sensitive transfer material (6) in the same manner as in Example 3.

The color forming density and the fog densities before and after thermo processing, of the light- and heat-sensitive transfer material (6), were measured in the same manners as in Example 6. Results are shown in the following Table 2.

TABLE 2

| | Sensitivity (mJ/cm$^2$) | Dmax | Dmin | Dmin-S after thermo processing |
|---|---|---|---|---|
| Example 3 | 1.05 | 1.43 | 0.08 | 0.08 |
| Example 4 | — | — | 0.10 | 0.12 |
| Comp. Ex. 4 | 1.2 | 1.50 | 0.28 | 0.49 |
| Comp. Ex. 5 | — | — | 1.5 | 1.9 |
| Comp. Ex. 6 | — | 1.43 | 1.43 | 1.42 |

As clearly seen from Table 2, high sensitivity was able to be achieved with images formed by using light- and heat-sensitive transfer materials (3) and (4) of the present invention in the image recording method of the present invention in which the exposure was carried out imagewise, the supports were removed after heating, and the fixing step in which the surfaces of the recording layers were irradiated with light was carried out. Further, images were able to be formed on image receiving sheets efficiently at the same time as development. There was hardly any increase in the density of the background portions due to the thermo processing. In the resultant images, the coloring caused by the spectral sensitization compound was thoroughly decolorized by irradiating the surfaces of the recording layers with light, and the diazonium salt compound which remained within the layers was deactivated and decomposed and the formed images were fixed, so that images which had excellent pure whiteness at the background portions thereof, high contrast and excellent storage stability were able to be formed on the image receiving sheets with efficiency.

On the other hand, as in Comparative Examples 4 and 5, with regard to the images which were formed by using the light- and heat-sensitive transfer materials (4) and (5) without a fixing step for irradiating the surfaces of the recording layers with light being carried out after exposure and heating, although images could be formed on the image receiving sheets, increases in densities of the background portions thereof due to the thermo processing were extremely large and images with high contrast and high sharpness were not able to be obtained. In the case of the light- and heat-sensitive transfer material (6) in Comparative Example 6 in which the photoinitiator prescribed in the present invention was not used, sufficient sensitivity was not able to be achieved and images could not be formed.

What is claimed is:

1. An image recording method comprising the steps of:
   (a) providing a light- and heat-sensitive transfer material, the material comprising:
   (i) a support;
   (ii) a light- and heat-sensitive transfer layer on the support, wherein the light- and heat-sensitive layer includes a color forming component; and
   (iii) a heat-bonding layer on the light- and heat-sensitive transfer layer;
   (b) irradiating the light- and heat-sensitive transfer material with light to form a latent image;
   (c) placing an image receiving material in surface contact with the light- and heat-sensitive transfer material;
   (d) heating the materials, wherein the color forming component forms color in accordance with the latent image so as to form an image;
   (e) removing the support to transfer the light- and heat-sensitive transfer layer to the image receiving material; and
   (f) irradiating the light- and heat-sensitive transfer layer with light to fix the image.

2. An image recording method according to claim 1, wherein said light- and heat-sensitive transfer material comprises a plurality of light- and heat-sensitive transfer layers, wherein the layers contain color forming components that form colors of different hues.

3. An image recording method according to claim 2, wherein in the step of irradiating the light- and heat-sensitive transfer material with light to form a latent image, latent images are formed on all of said light- and heat-sensitive transfer layers, and thereafter said steps of placing an image receiving material, heating the materials, removing the support, and irradiating the light- and heat-sensitive transfer layer with light to fix the image, are carried out in that order.

4. An image recording method according to claim 2, wherein the light- and heat-sensitive transfer material includes a plurality of light- and heat-sensitive transfer layers having color forming hues of black, cyan, magenta, and yellow.

5. An image recording method according to claim 1, wherein
   (a') providing first and second light- and heat-sensitive transfer materials, each of the first material and second material comprise the support, the light- and heat-sensitive transfer layer and the heat-bonding layer, and the light- and heat-sensitive transfer layers have respectively different color forming hues, and
   steps (b), (c) and (d) are conducted for the first light- and heat-sensitive transfer material, steps (b), (c) and (d) are conducted for the second light- and heat-sensitive transfer material, and thereafter step (e) is conducted for the first and second light- and heat-sensitive transfer materials.

6. An image recording method according to claim 1, further comprising the step of preheating substantially the entire surface of the light- and heat-sensitive transfer material to a predetermined temperature less than a temperature for forming color, prior to the step (d).

7. An image recording method according to claim 1, wherein the light- and heat-sensitive transfer layer includes color forming components disposed in microcapsules, and a composition disposed outside of the microcapsules, having a polymerizable group and a moiety reactable with the color forming components for forming color, and a photoinititator.

8. An image recording method comprising the steps of:
   (a) providing a light- and heat-sensitive transfer material having a light- and heat-sensitive layer, a heat-bonding layer and a support layer, wherein the light- and heat-sensitive layer includes microcapsules encapsulating a color forming component;
   (b) irradiating the light- and heat-sensitive transfer material with light having a wavelength from 300 nm to 1000 nm to form a latent image;
   (c) placing the light- and heat-sensitive transfer material in surface contact with an image receiving material;
   (d) heating the material to a temperature, wherein the color forming component forms color in accordance with the latent image so as to form an image;
   (e) removing the support layer from the light- and heat-sensitive transfer material; and
   (f) irradiating the materials with light to fix the image.

9. The method of claim 8, wherein the light- and heat-sensitive layer includes a composition disposed outside of the microcapsules, including a compound having a polymerizable group and a moiety reactable with color forming components for forming color, and a photoinitiator.

10. The method of claim 8, wherein the step of irradiating the light- and heat-sensitive transfer material is performed by using a laser having a wavelength greater than that of short-wave visible light.

* * * * *